(12) United States Patent
Matocha et al.

(10) Patent No.: US 10,804,175 B2
(45) Date of Patent: Oct. 13, 2020

(54) SEMICONDUCTOR DEVICES COMPRISING GETTER LAYERS AND METHODS OF MAKING AND USING THE SAME

(71) Applicant: Monolith Semiconductor Inc., Round Rock, TX (US)

(72) Inventors: Kevin Matocha, Round Rock, TX (US); John Nowak, Bertram, TX (US); Kiran Chatty, Round Rock, TX (US); Sujit Banerjee, Round Rock, TX (US)

(73) Assignee: MONOLITH SEMICONDUCTOR, INC., Round Rock, TX (US)

( * ) Notice: Subject to any disclaimer, the term of this patent is extended or adjusted under 35 U.S.C. 154(b) by 606 days.

(21) Appl. No.: 15/446,271

(22) Filed: Mar. 1, 2017

(65) Prior Publication Data

US 2017/0178989 A1    Jun. 22, 2017

Related U.S. Application Data

(60) Continuation of application No. 15/217,777, filed on Jul. 22, 2016, now Pat. No. 9,620,428, which is a
(Continued)

(51) Int. Cl.
*H01L 29/161* (2006.01)
*H01L 23/26* (2006.01)
(Continued)

(52) U.S. Cl.
CPC .......... *H01L 23/26* (2013.01); *H01L 21/0445* (2013.01); *H01L 21/0485* (2013.01);
(Continued)

(58) Field of Classification Search
CPC ......... H01L 21/823475; H01L 21/0485; H01L 29/45; H01L 21/0445; H01L 29/1608; H01L 29/66068
See application file for complete search history.

(56) References Cited

U.S. PATENT DOCUMENTS 4,589,928 A    5/1986  Dalton et al.
5,229,311 A    7/1993  Lai et al.
(Continued)

FOREIGN PATENT DOCUMENTS

EP          1003208 A2    5/2000
WO    2012/135288 A1    10/2012

OTHER PUBLICATIONS

M.E. Alperin, et al., "Development of the Self-Aligned Titanium Silicide Process for VLSI Applications," IEEE Transactions on Electron Devices, Feb. 1985, 32(2): 141-149.
(Continued)

*Primary Examiner* — George R Fourson, III

(57) ABSTRACT

Semiconductor devices comprising a getter material are described. The getter material can be located in or over the active region of the device and/or in or over a termination region of the device. The getter material can be a conductive or an insulating material. The getter material can be present as a continuous or discontinuous film. The device can be a SiC semiconductor device such as a SiC vertical MOSFET. Methods of making the devices are also described. Semiconductor devices and methods of making the same comprising source ohmic contacts formed using a self-aligned process are also described. The source ohmic contacts can comprise titanium silicide and/or titanium silicide carbide and can act as a getter material.

10 Claims, 22 Drawing Sheets

Related U.S. Application Data division of application No. 14/680,766, filed on Apr. 7, 2015, now Pat. No. 9,425,153, which is a continuation-in-part of application No. 14/245,172, filed on Apr. 4, 2014, now Pat. No. 9,035,395.

(60) Provisional application No. 61/808,332, filed on Apr. 4, 2013.

(51) Int. Cl.
```
H01L 23/00      (2006.01)
H01L 29/16      (2006.01)
H01L 29/45      (2006.01)
H01L 29/78      (2006.01)
H01L 21/283     (2006.01)
H01L 23/31      (2006.01)
H01L 29/10      (2006.01)
H01L 21/04      (2006.01)
H01L 29/66      (2006.01)
H01L 29/06      (2006.01)
H01L 29/739     (2006.01)
H01L 29/08      (2006.01)
H01L 21/8234    (2006.01)
H01L 29/808     (2006.01)
H01L 29/744     (2006.01)
H01L 29/872     (2006.01)
```

(52) U.S. Cl.
CPC ........ *H01L 21/283* (2013.01); *H01L 23/3171* (2013.01); *H01L 23/3192* (2013.01); *H01L 23/564* (2013.01); *H01L 24/05* (2013.01); *H01L 29/0615* (2013.01); *H01L 29/1095* (2013.01); *H01L 29/1608* (2013.01); *H01L 29/45* (2013.01); *H01L 29/66068* (2013.01); *H01L 29/7395* (2013.01); *H01L 29/7811* (2013.01); *H01L 29/7823* (2013.01); H01L 21/823475 (2013.01); H01L 29/0843 (2013.01); H01L 29/66893 (2013.01); H01L 29/744 (2013.01); H01L 29/8083 (2013.01); H01L 29/872 (2013.01); H01L 2224/02166 (2013.01); H01L 2224/051 (2013.01); H01L 2224/0517 (2013.01); H01L 2224/0519 (2013.01); H01L 2224/05111 (2013.01); H01L 2224/05164 (2013.01); H01L 2224/05166 (2013.01); H01L 2224/05169 (2013.01); H01L 2224/05172 (2013.01); H01L 2224/05184 (2013.01); H01L 2224/05567 (2013.01); H01L 2924/00014 (2013.01); H01L 2924/10272 (2013.01); H01L 2924/12032 (2013.01); H01L 2924/1301 (2013.01); H01L 2924/1305 (2013.01); H01L 2924/13055 (2013.01); H01L 2924/13062 (2013.01); H01L 2924/13063 (2013.01); H01L 2924/13091 (2013.01); H01L 2924/181 (2013.01)

(56) References Cited

U.S. PATENT DOCUMENTS

| | | | |
|---|---|---|---|
| 6,060,766 A | 5/2000 | Mehta et al. | |
| 6,071,784 A | 6/2000 | Mehta et al. | |
| 6,410,460 B1* | 6/2002 | Shalish | H01L 21/048 |
| | | | 257/E21.061 |
| 6,734,462 B1* | 5/2004 | Shah | H01L 29/744 |
| | | | 257/107 |
| 7,262,434 B2* | 8/2007 | Okamura | H01L 29/872 |
| | | | 257/77 |
| 7,629,653 B1 | 12/2009 | Sadoughi et al. | |
| 8,035,112 B1 | 10/2011 | Cooper et al. | |
| 8,120,074 B2 | 2/2012 | Schulze et al. | |
| 9,425,153 B2* | 8/2016 | Matocha | H01L 29/0615 |
| 2001/0011729 A1* | 8/2001 | Singh | H01L 29/66068 |
| | | | 257/77 |
| 2006/0118818 A1 | 6/2006 | Shimoida et al. | |
| 2007/0018272 A1* | 1/2007 | Henning | H01L 21/045 |
| | | | 257/472 |
| 2008/0108190 A1 | 5/2008 | Matocha et al. | |
| 2009/0189160 A1 | 7/2009 | Ahn et al. | |
| 2010/0163888 A1* | 7/2010 | Saggio | H01L 29/0619 |
| | | | 257/76 |
| 2010/0320530 A1* | 12/2010 | Cheng | H01L 29/1004 |
| | | | 257/329 |
| 2011/0254010 A1 | 10/2011 | Zhang | |
| 2012/0132912 A1* | 5/2012 | Suekawa | H01L 29/45 |
| | | | 257/49 |
| 2012/0193702 A1* | 8/2012 | Machida | H01L 29/7802 |
| | | | 257/329 |
| 2013/0043524 A1* | 2/2013 | Yamagami | H01L 21/8213 |
| | | | 257/328 |
| 2013/0075756 A1 | 3/2013 | Arthur et al. | |
| 2013/0146898 A1 | 6/2013 | Matocha et al. | |
| 2013/0168700 A1* | 7/2013 | Furukawa | H01L 29/7805 |
| | | | 257/77 |
| 2014/0027781 A1 | 1/2014 | Ryu | |
| 2014/0034963 A1 | 2/2014 | Michael et al. | |
| 2014/0167068 A1 | 6/2014 | Stum et al. | |
| 2014/0264382 A1* | 9/2014 | MacMillan | H01L 29/1608 |
| | | | 257/77 |
| 2015/0042177 A1 | 2/2015 | Weyers et al. | |
| 2015/0084066 A1 | 3/2015 | Banerjee et al. | |
| 2015/0236012 A1 | 8/2015 | Hino et al. | |

OTHER PUBLICATIONS

J. Crofton, et al., "Titanium and Aluminum—Titanium Ohmic Contacts to p-Type SiC," Solid State Electronics, Nov. 1997, 41(11): 1725-1729, Elsevier Science Ltd., Great Britain.

F. Goesmann et al., "Temperature-dependent interface reactions and electrical contact properties of titanium on 6H—SiC," Semicond. Sci. Technol., 1995, 10: 1652-1658, IP Publishing Ltd., UK.

F. La Via, et al., "Structural and electrical characterization of titanium and nickel silicide contacts on silicon carbide," Microelectronic Engineering, 2002, 60:269-282, Elsevier Science B.V.

D. Levy, et al., "Optimization of a Self-Aligned Titanium Silicide Process for Submicron Technology," IEEE Transaction on Semiconductor Manufacturing, Nov. 1990, 3(4): 168-175.

A. Makhtari, et al., "Structural Characterisation of titanium silicon carbide reaction," Microelectronic Engineering, 2001, 55: 375-381, Elsevier Science B.V.

M. Matin, et al., "A Self-Aligned Process for High-Voltage, Short-Channel Vertical DMOSFETs in 4H—SiC," IEEE Transactions on Electron Devices, Oct. 2004, 51(10): 1721-1725.

L.M. Porter, et al., "Chemistry, microstructure, and electrical properties at interfaces between thin films of titanium and alpha (6H) silicon carbide (0001)," J. Mater. Res., Mar. 1995, 10(3): 668-679, Material Research Society.

F. Roccaforte, et al., "Ohmic Contacts to SiC," International Journal of High Speed Electronics and Systems, Dec. 2005, 15(4): 781-820, World Scientific Publishing Company.

\* cited by examiner

SEMICONDUCTOR DEVICES COMPRISING GETTER LAYERS AND METHODS OF MAKING AND USING THE SAME

CROSS REFERENCE TO RELATED APPLICATIONS

This application is a continuation of U.S. patent application Ser. No. 15/217,777, filed Jul. 22, 2016, which is a divisional of U.S. patent application Ser. No. 14/680,766, filed Apr. 7, 2015, now U.S. Pat. No. 9,425,153, which is a continuation-in-part of U.S. patent application Ser. No. 14/245,172, filed on Apr. 4, 2014, now U.S. Pat. No. 9,035,395, which claims the benefit of Provisional U.S. Patent Application Ser. No. 61/808,332, filed Apr. 4, 2013. Each of the above-referenced applications is incorporated by reference herein in its entirety.

BACKGROUND

Technical Field

This application relates generally to semiconductor devices comprising one or more layers of a getter material and to methods of making and using the devices.

Background of the Technology

Silicon carbide devices are advantageous in some applications over silicon devices due to the approximately 10× larger critical electric field strength of SiC over silicon. Also, the wide bandgap of SiC (3.2 eV) versus silicon (1.1 eV) allows SiC based devices to operate at much higher temperature than silicon devices. These properties are advantageous for applications requiring high-temperature and high-power.

Silicon carbide MOSFETs have been observed to be susceptible to Bias-Temperature Instability (BTI). Also, in SiC diodes and transistors, premature failure has been observed, particularly under voltage blocking conditions.

While not wishing to be bound by theory, the presence of chemical species may interact with the SiC electronic device to cause bias-temperature instability or premature device failure. Any changes in the concentration of the chemical species with operating condition, temperature or time can cause undesirable, unstable variations in their performance, or complete device failure.

Semiconductor devices are, by their nature, controlled by the presence or absence of mobile or stationary charges in the device. These charges can be located in the semiconductor or in other materials in the device such as metals or dielectrics. The charges may include donor and acceptor ions, electrons and holes, and other chemical species.

Semiconductor devices can be affected by chemical species that interact with the semiconductor to affect the device performance. This may include changes in the device parameters, such as leakage current, carrier lifetime, threshold voltage, blocking voltage, bipolar gain, channel mobility, and/or transconductance.

Semiconductor devices such as silicon MOSFETs or GaAs HEMTs have been demonstrated to be susceptible to the presence of chemical species in the device, such as hydrogen and/or water. Silicon carbide devices may also be susceptible to chemical species in the device, such as hydrogen and/or water or other species. Silicon carbide devices in structures such as bipolar transistors, IGBTs, MOSFETs, thyristors, JFETs, IGBTs and other electronic devices may be affected by these chemical species to affect the blocking voltage, gain, mobility, surface recombination velocity, carrier lifetime, oxide reliability, blocking voltage and other device parameters.

However due to the properties of SiC compared to silicon, SiC-based devices may be additionally susceptible to the influence of chemical species. Silicon carbide may be susceptible to the effects of these chemical species due to the much higher electric fields that are present in silicon carbide devices (in comparison to silicon and GaAs devices). Also, since SiC devices can operate at higher temperature (up to 500° C. or higher), operating at these temperatures may cause chemical species to be more reactive, have higher solubility and/or have increased diffusivity than devices that operate at lower temperature.

Accordingly, there still exists a need for semiconductor devices having improved device stability.

SUMMARY

According to a first embodiment, a semiconductor device is provided which comprises:

a semiconductor substrate layer of a first conductivity type;

a drift layer of a semiconductor material of the first conductivity type on the substrate layer;

a first well region of a semiconductor material of a second conductivity type different than the first conductivity type in the drift layer in a central portion of the device;

a second well region of a semiconductor material of the second conductivity type in the drift layer and spaced from the first well region in the central portion of the device forming a JFET region between the first and second well regions;

a first source region of a semiconductor material of the first conductivity in the first well region and spaced from the JFET region such that an inner portion of the first well region is adjacent the JFET region;

a second source region of a semiconductor material of the first conductivity in the second well region and spaced from the JFET region such that an inner portion of the second well region is adjacent the JFET region;

a first outer region of semiconductor material of the second conductivity type adjacent the first source region opposite the JFET region;

a second outer region of semiconductor material of the second conductivity type adjacent the second source region opposite the JFET region;

a first gate dielectric layer on the drift layer and in contact with the inner regions of the first and second well regions and the JFET region;

a gate electrode on the first gate dielectric layer;

an interlayer dielectric material on the gate electrode, on the first and second source regions and on the first and second outer regions;

a first opening through the interlayer dielectric material over the first source region;

a second opening through the interlayer dielectric material over the second source region;

a first source ohmic contact on the first source region in the first opening; and a second source ohmic contact on the second source region in the second opening;

a source metal in electrical communication with the first and second source ohmic contacts.

According to a second embodiment, a semiconductor device is provided which comprises:

a dielectric material on adjacent n-type and p-type SiC regions; and an opening through the dielectric material exposing n-type and p-type SiC material of the underlying n-type and p-type SiC regions at the bottom of the opening;

an ohmic contact on the n-type and p-type SiC material at the bottom of the opening, the ohmic contact comprising titanium silicide and/or titanium silicide carbide.

According to a third embodiment, a method of making a semiconductor device is provided which comprises:

depositing titanium on an n-type SiC region and on an adjacent p-type SiC region at the bottom of an opening formed through a dielectric material; and annealing the titanium in contact with the n-type SiC and p-type SiC regions;

wherein annealing forms an ohmic contact with the n-type and p-type SiC regions, the ohmic contact comprising titanium silicide and/or titanium silicide carbide.

The titanium silicide carbide in the ohmic contacts can act as a getter material. A layer of additional getter material (e.g., Ti/TiN) can be formed over the ohmic contacts. Plugs (e.g., Tungsten plugs) can be formed in the openings through the dielectric material to form a more planar surface for further processing.

DETAILED DESCRIPTION

Figure 1:
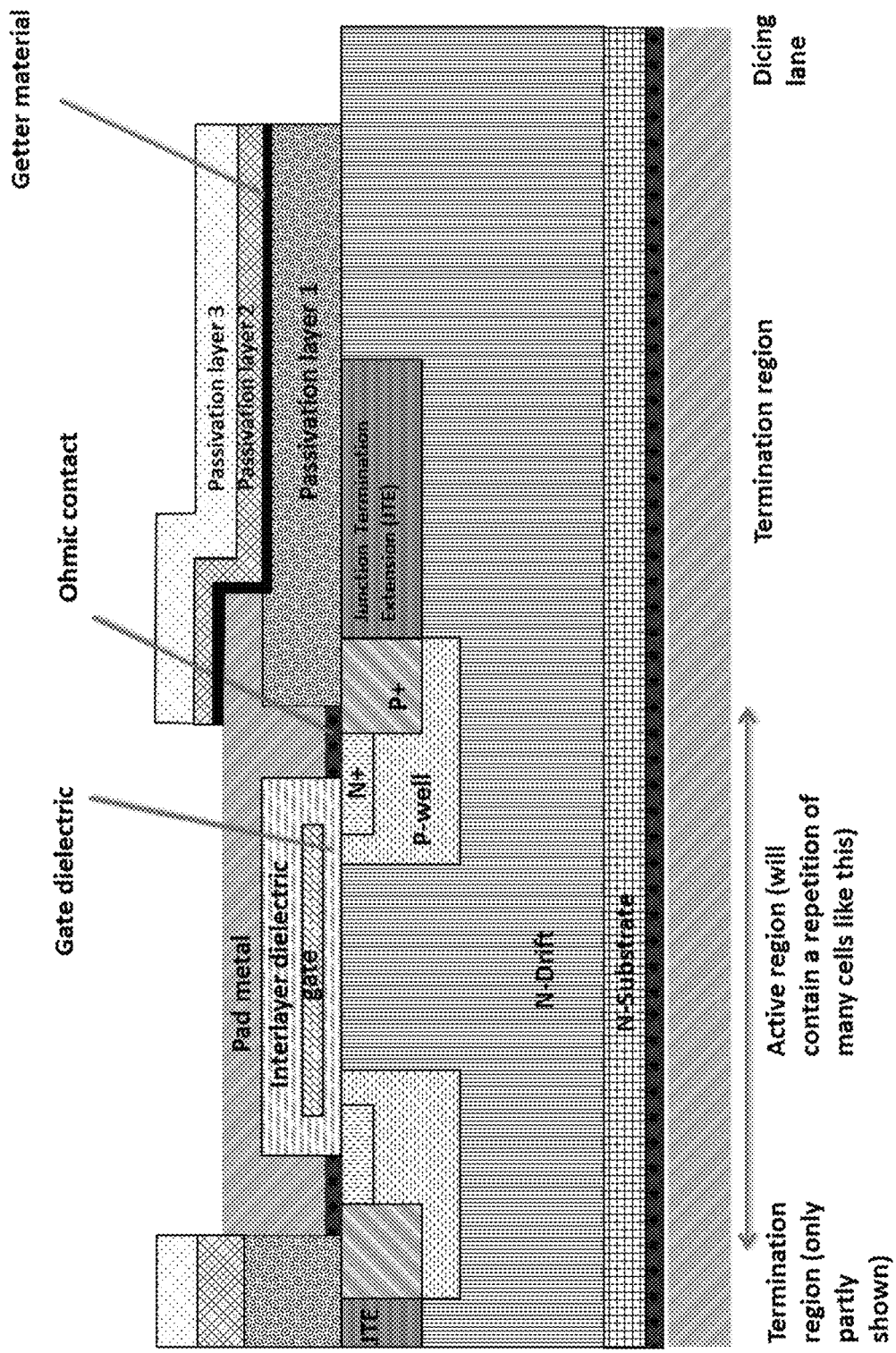
FIG. 1 is a cross-sectional view of a first embodiment of a silicon carbide vertical MOSFET showing a single cell of the active region and the periphery including the termination and multiple passivation layers, wherein the device comprises a getter material in the termination region between two passivation layers.

As described herein, a layer which is "on" another underlying layer can be on and directly in contact with the underlying layer or there can be one or more layers between that layer and the underlying layer.

As used herein, a titanium silicide is a compound containing titanium and silicon Exemplary titanium silicides include $Ti_3Si$, $TiSi_2$, $Ti_5Si_4$, $Ti_5Si_3$, and $TiSi$.

As used herein, a titanium silicide carbide is a compound containing titanium, silicon and carbon. Exemplary titanium silicide carbides include $Ti_3SiC_2$.

This application describes techniques to partially or fully ameliorate the impact of chemical species on the semiconductor device. The semiconductor device advantageously includes a getter material to "getter" (collect and/or immobilize) the chemical species, immobilizing these chemical species to reduce or eliminate the effect of the chemical species on the semiconductor device. This getter material may getter one or more chemical species including hydrogen, water or other chemical species. The getter layer can getter chemical species present in one or more layers of the device, including dielectrics, polysilicon and metals. Also, the getter layer may also act to immobilize and/or block chemical species that may enter the device from the outside of the device, to prevent or reduce the effect of these species to affect the device performance.

According to some embodiments, the getter material can be implemented as a continuous film across the device. The getter material may be located in various regions of the device. It can be located in or over the active area of the device and/or in or over the termination region of the device.

According to some embodiments, the getter material can be an insulating material positioned in the termination region of the device. Alternately, an insulating or conducting getter material can be dispersed in a matrix or the getter material can be present in isolated regions so that a plurality of discontinuous getter regions is present. In the termination region of the device, the getter may be made of any material, but is preferably an insulator, or as a conductor in isolated regions or in a matrix form with other insulating material. According to some embodiments, the getter material may be a polymer material.

According to some embodiments, the getter material is present in or over the active region of the device and is conductive. Non-conductive or insulating getter materials can also be used in the active region of the device. According to some embodiments, a conductive getter material used in the active region can be part of the contacts or electrodes of the device. According to some embodiments, the drain, source and/or gate electrodes may comprise the conductive getter material.

Different materials may be used as the getter. One or more getter materials may be used in the same device. Multiple getter layers or regions can be used on the same device. The same or different getter materials may be used in or over the active area and termination regions of the device. A multi-layer stack of differing or the same material may be used.

The getter can be structured in the form of a matrix of multiple material types, including one or more getter materials. The getter material may be included on the device die. The getter material can alternately be included in the mold compound of the packaging materials.

Exemplary getter materials include, but are not limited to, the following materials:

Titanium (Ti) and titanium compounds, including TiSi, TiN, TiW;

Tungsten (W) and tungsten compounds, including tungsten silicide;

Barium;

Zirconium (Zr) and zirconium compounds, including but not limited to ZrO;

Palladium (Pd) and palladium compounds, including but not limited to PdO;

Platinum (Pt) and platinum compounds, including but not limited to PtO;

Vanadium (V);

Tin (Sn);

Antimony (Sb);

Germanium (Ge);

polymeric getter materials; and zeolites.

Exemplary hydrogen barrier materials include, but are not limited to, the following materials:

Titanium (Ti) and titanium compounds including, but not limited to, titanium silicide, TiW, and TiN;

dielectric materials including, but not limited to, Silicon nitride; and zeolites.

The getter layer can be provided "on top" of the interlayer dielectric layers. The getter layer can be provided as an intermediary layer between dielectric layers. The getter layer can be provided as a conductor and may contribute additional functions related to the metallization layers or contact layers. The getter layer may be provided as all or part of the gate electrode or may be part of the contact layer to the gate electrode.

To prevent additional incorporation of chemical species from the ambient around the device, a chemical barrier may be provided. This barrier is provided on or in the device to prevent further incorporation of chemical species into the device from the ambient. This chemical barrier may include one or more layers to prevent incorporation of one or more chemical species into the chemically sensitive regions of the device.

The semiconductor device can be fabricated using a variety of semiconductor processing techniques. One embodiment of a method of forming a semiconductor device comprising a getter layer is described below. This method can be used to manufacture a device as shown in the drawings.

A starting semiconductor wafer is provided with an epitaxially-grown layer with n-type doping of a specified concentration and thickness. Several patterning and ion-implantation steps are used to form the p-well, n-plus source, p-plus and p-type termination regions. The ion implants are activated by annealing at high temperatures, for example up to 1600° C. The gate oxide is then formed by thermal treatment in an oxidizing ambient. The gate electrode is deposited followed by patterning and forming interlayer-dielectric and Ohmic contacts, for example using nickel. The Ohmic contacts are annealed, for example up to 1100° C. The getter layer is then deposited and patterned and etched. The final metal such as Aluminum is then deposited and patterned and etched to form the source and gate pads. A final passivation layer may be deposited and patterned, such as polyimide.

FIG. 1 is a cross-sectional view of an embodiment of a vertical SiC MOSFET which comprises a getter layer in the termination region. Several regions are described including an active region, a termination region and a dicing lane. As depicted, this structure comprises an n+ SiC substrate with an n-type doped drift epilayer. Within the epilayer are several doped regions of n-type and p-type, including a p-well region, a p+ region, an n+ source and p-type Junction Termination Extension (JTE) region. The n+ source region and the p+ regions are contacted by an Ohmic contact. A gate dielectric is provided with a gate electrode (labeled "gate") located on top of the gate dielectric. An interlayer dielectric is provided between the gate electrode and the pad metal. The pad metal electrically contacts the Ohmic contact regions. Also provided are several passivation layers. The active region consists of one more repetitions of the basic active cell structure. The active region is surrounded by a termination. The termination region is then itself further surrounded by a dicing lane. In this embodiment, a getter is layer is provided in between the passivation layers. The getter layer is provided in the termination region of the device between the dicing lane and extending into the active region of the device, optionally touching the pad metal.

Figure 2:
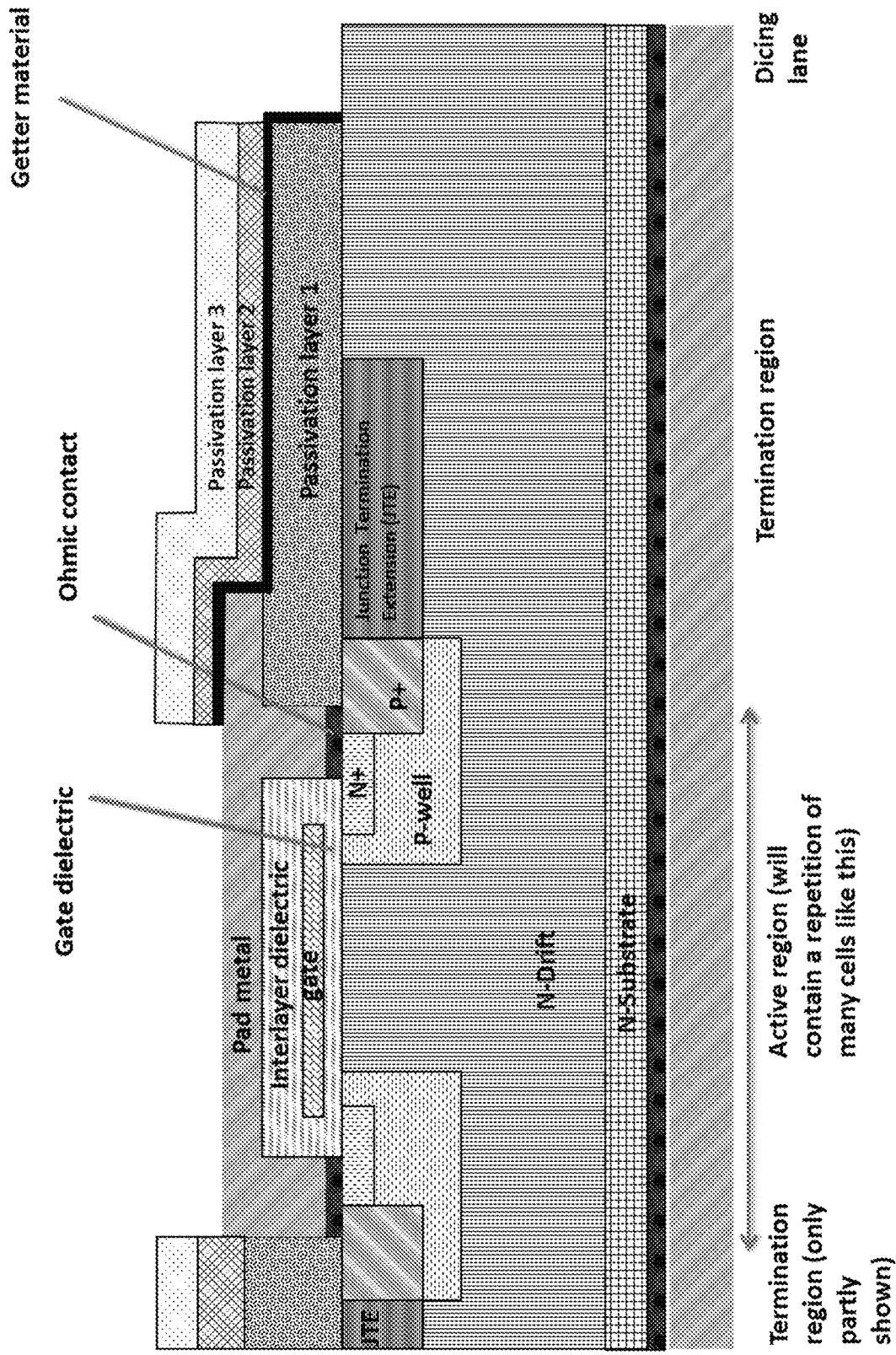
FIG. 2 is a cross-sectional view of a second embodiment of a silicon carbide vertical MOSFET comprising a getter material in the termination region, including along the edge of the passivation layer to the SiC surface.

FIG. 2 is a cross-sectional view of an embodiment of a vertical SiC MOSFET including a getter layer in the termination region and the dicing lane. In this embodiment, the device comprises a plurality of passivation layers and the getter material is provided between passivation layers. The getter layer touches the SiC surface at the dicing layer, then extends vertically up the sidewall of the passivation, and then extends in between the passivation layers and into the active region. Optionally, the getter layer touches the pad metal.

Figure 3:
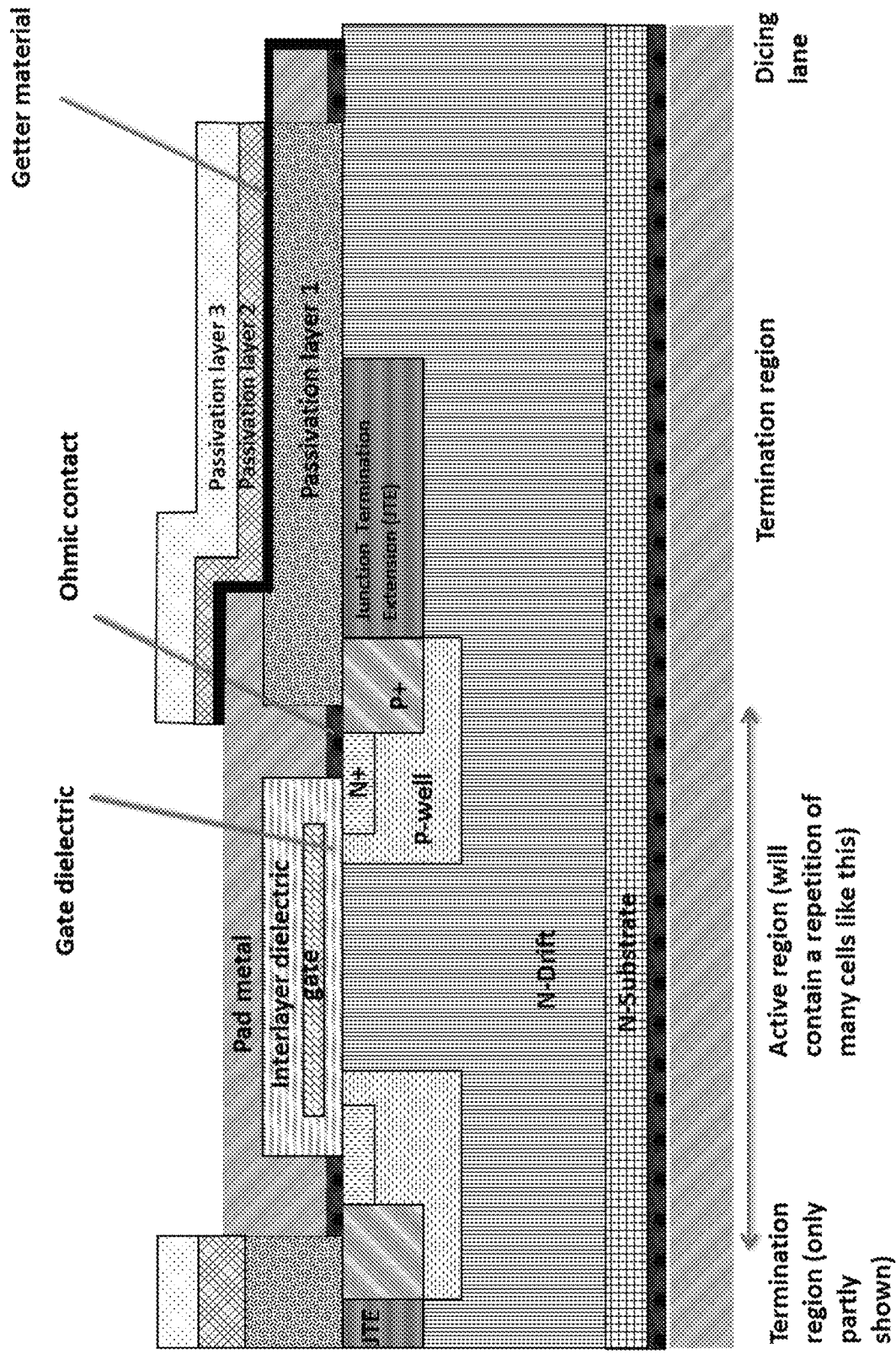
FIG. 3 is a cross-sectional view of a third embodiment of a silicon carbide vertical MOSFET comprising a getter material in the termination region, including in the dicing lane over the pad metal.

FIG. 3 is a cross-sectional view of an embodiment of a vertical SiC MOSFET including a getter layer in the termination region and the dicing lane. In this embodiment, the Ohmic contact and pad metal is provided in the dicing lane. The getter layer touches the SiC surface, extends up the pad metal, across the top of the pad layer, then in between two passivation layers and into the active region of the device. Optionally, the getter layer extends over a portion of the pad metal in the active region of the device.

Figure 4:
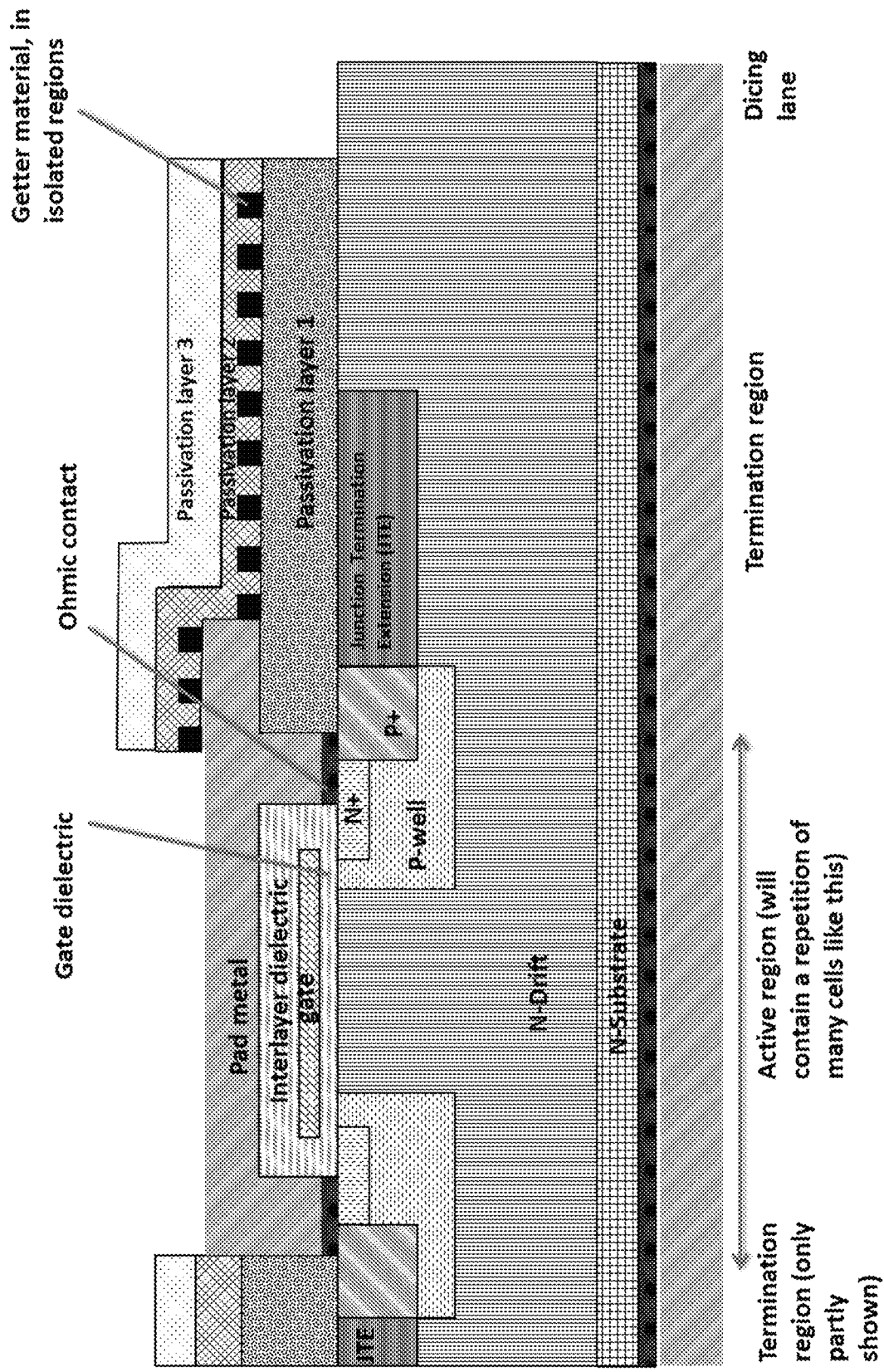
FIG. 4 is a cross-sectional view of a fourth embodiment of a silicon carbide vertical MOSFET comprising a getter material in the termination region in isolated regions in between passivation layers.

FIG. 4 is a cross-sectional view of an embodiment of a vertical SiC MOSFET including isolated getter regions in the termination region. In this embodiment, a getter material is provided in distinct regions in the termination region. These distinct regions consist of either isolated regions of the getter material or a grid-like structure of the getter material. The getter is provided between two passivation layers.

Figure 5:
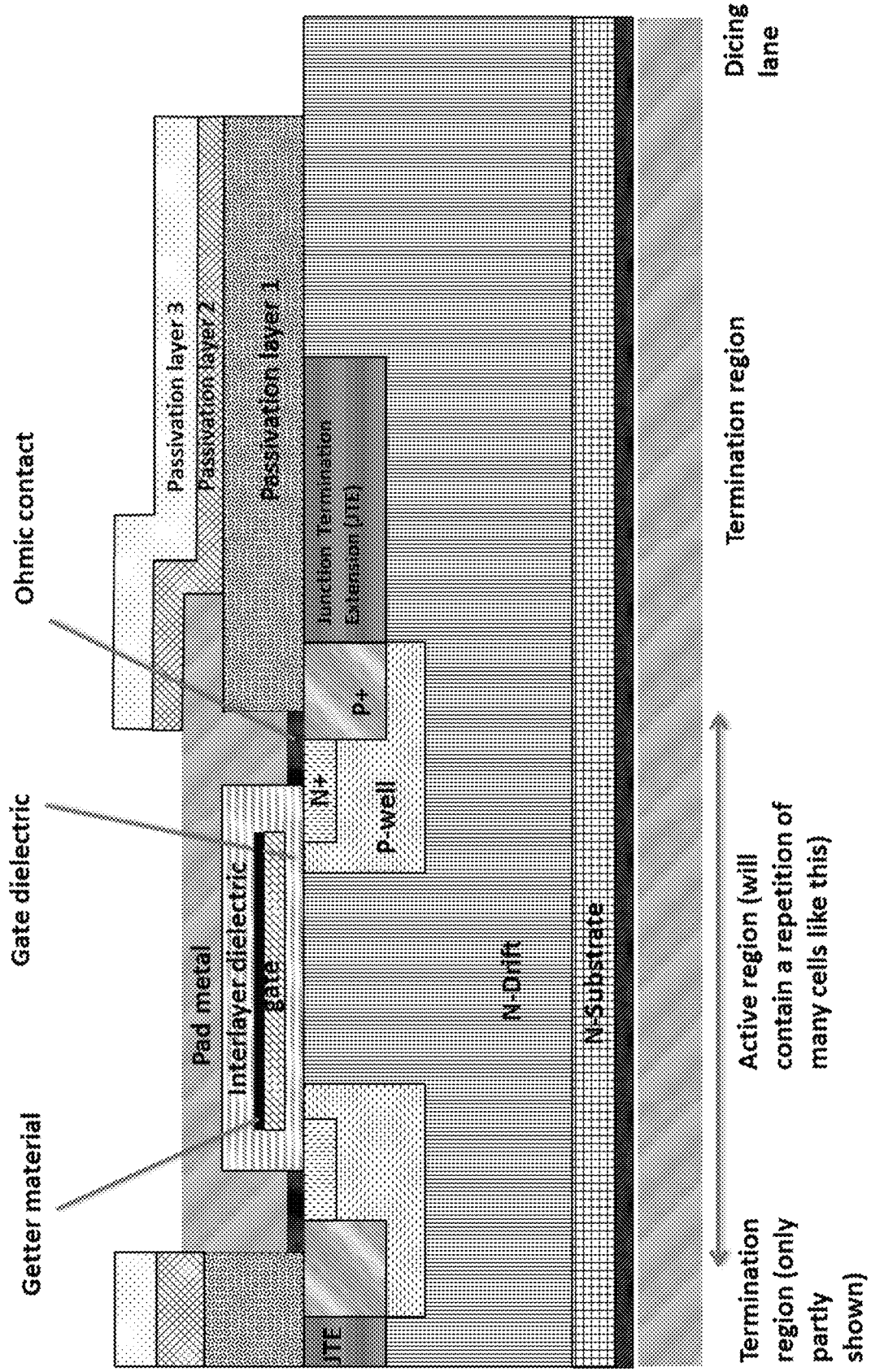
FIG. 5 is a cross-sectional view of a fifth embodiment of a silicon carbide vertical MOSFET comprising a getter material over the gate electrode.

FIG. 5 is a cross-sectional view of an embodiment of a vertical SiC MOSFET including a getter region in the active region of the device. In this embodiment, the getter region is provided in between the gate electrode and below the interlayer dielectric.

Figure 6:
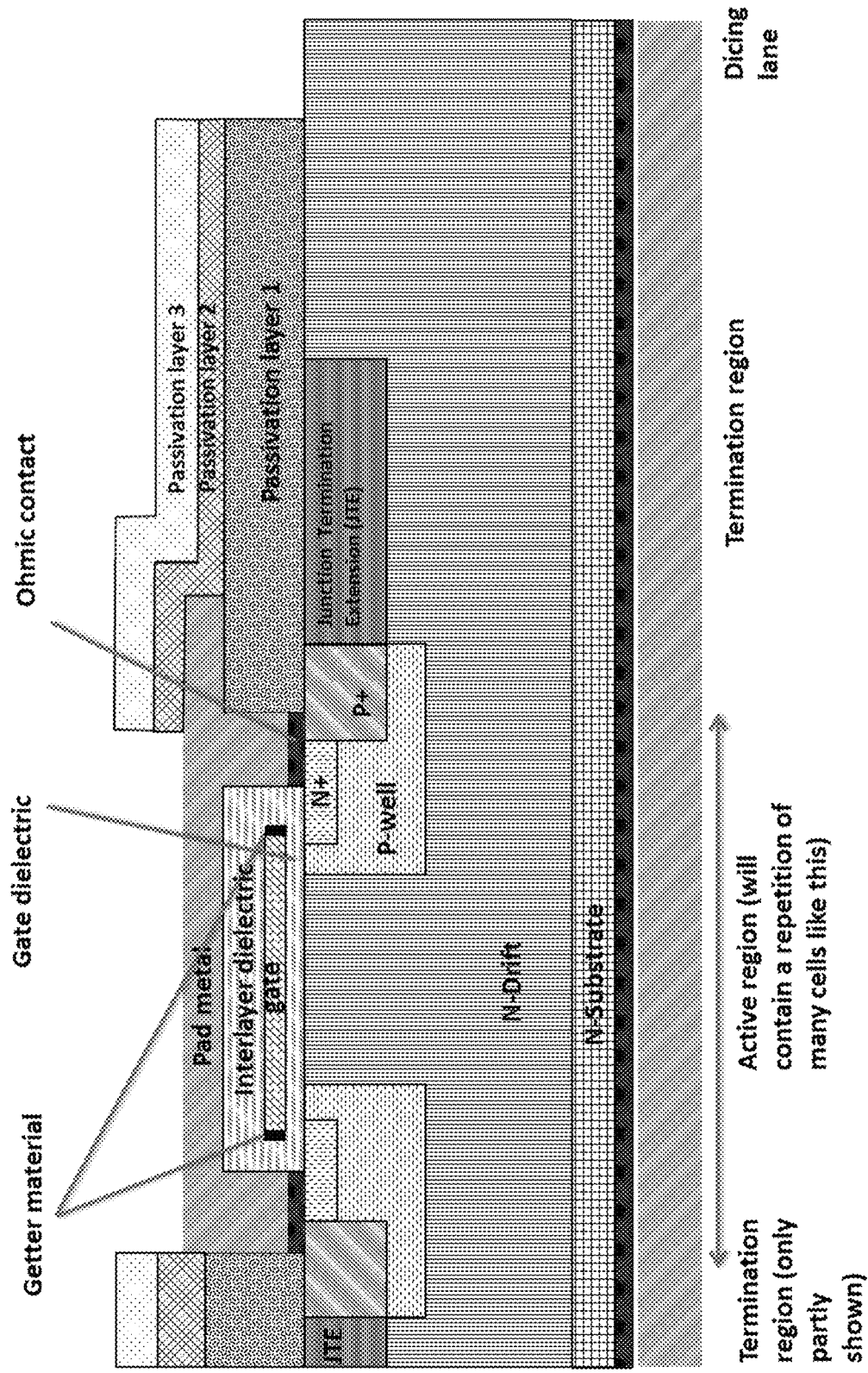
FIG. 6 is a cross-sectional view of a sixth embodiment of a silicon carbide vertical MOSFET comprising a getter material adjacent to the gate electrode.

FIG. 6 is a cross-sectional view of an embodiment of a vertical SiC MOSFET including a getter layer in the active region of the device. In this embodiment, the getter region is provided at the edges of the gate region in between the edge of the gate electrode and the interlayer dielectric. In this embodiment, the getter layer is provided in region to collect undesired species (such as hydrogen) that would otherwise diffuse into the gate dielectric and possibly cause threshold voltage instability.

Figure 7:
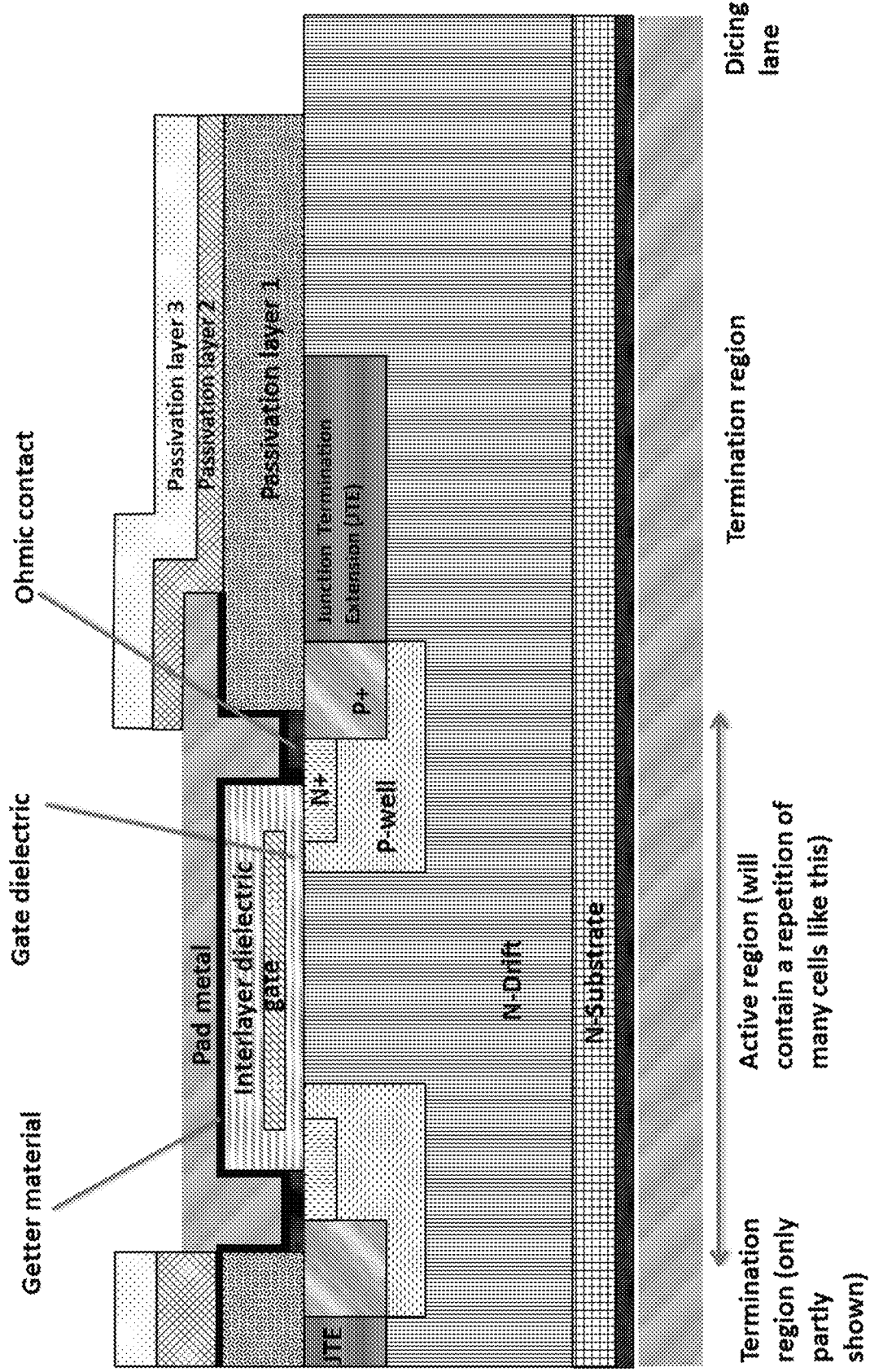
FIG. 7 is a cross-sectional view of a seventh embodiment of a silicon carbide vertical MOSFET comprising a getter layer in between the pad metal and underlying structures.

FIG. 7 is a cross-sectional view of an embodiment of a vertical SiC MOSFET including a getter layer in the active region of the device. In this embodiment, the getter layer is provided between the pad metal and all underlying layers.

Figure 8:
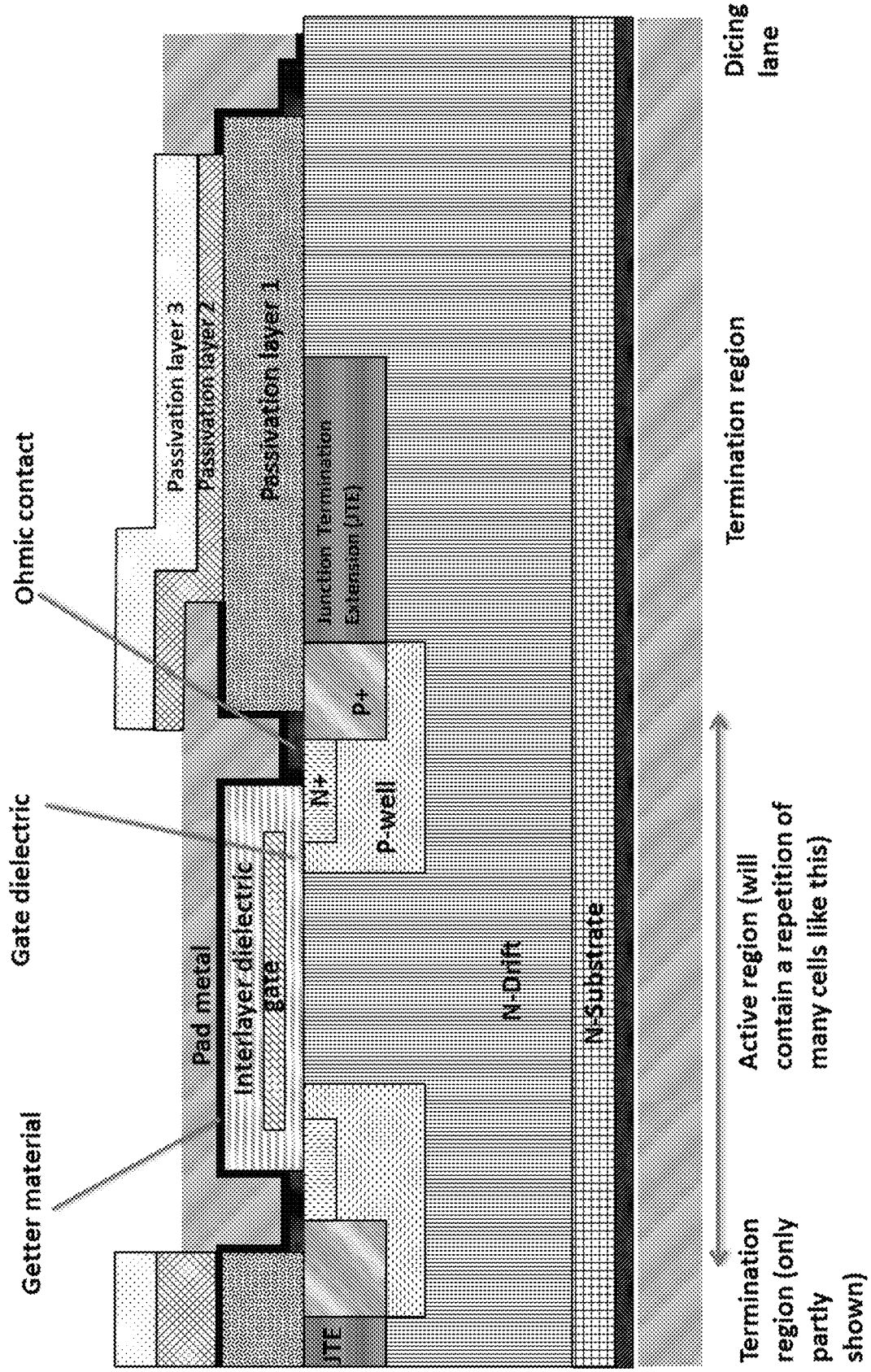
FIG. 8 is a cross-sectional view of a eighth embodiment of a silicon carbide vertical MOSFET comprising a getter layer in between the pad metal and underlying structures, including in the dicing lane region.

FIG. 8 is a cross-sectional view of an embodiment of a vertical SiC MOSFET including a getter layer in the active area of the device and in the dicing lane. In this embodiment, the getter layer is provided between the pad metal and all underlying layers, both in the active region and in the dicing lane region. In this embodiment, the Ohmic contact is provided in the dicing lane. The getter layer extends over the Ohmic contact and extends to touch the SiC layer. Optionally, the getter layer extends between the dicing lane and the passivation layer in the termination region of the device.

Figure 9:
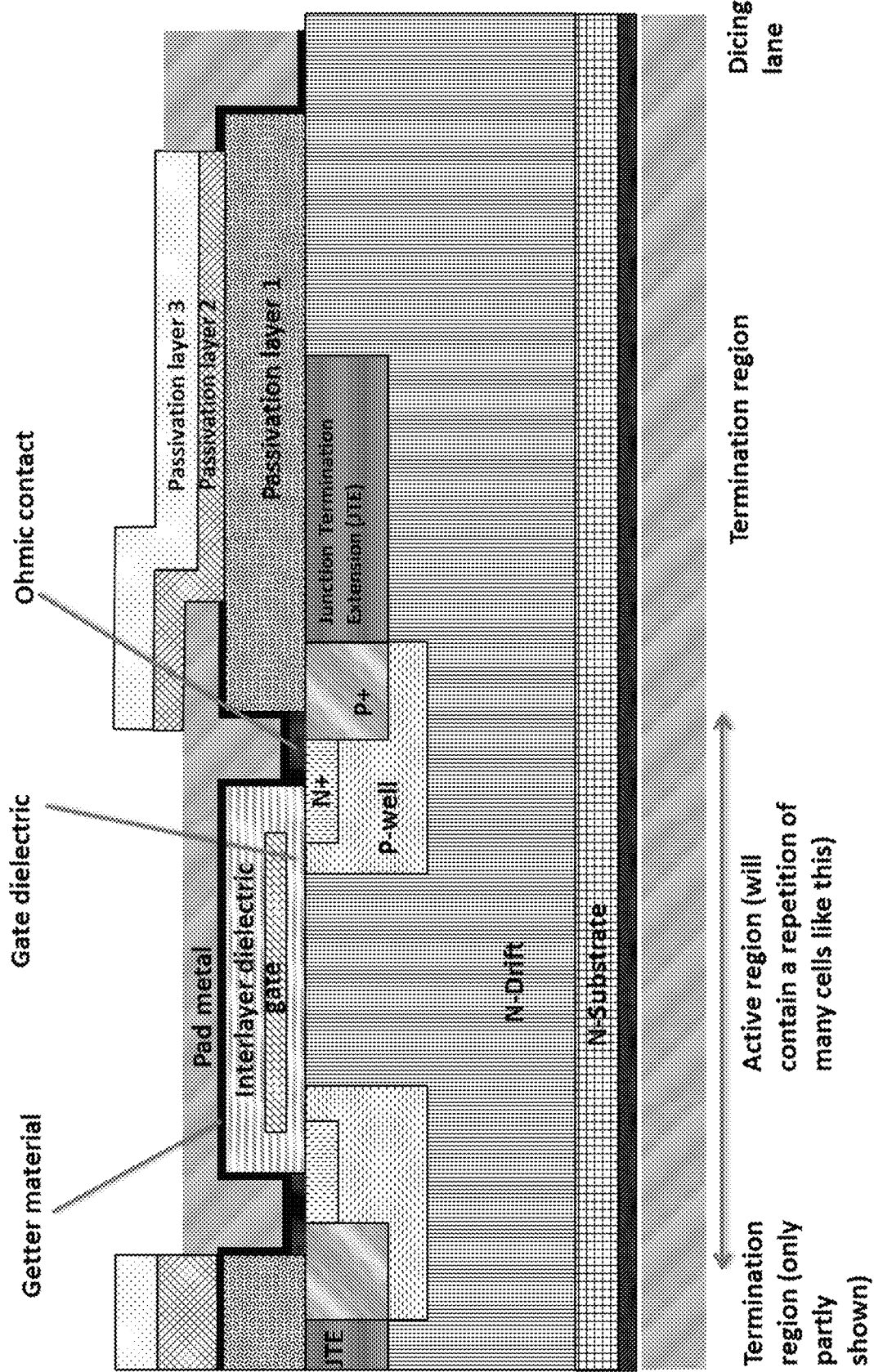
FIG. 9 is a cross-sectional view of a ninth embodiment of a silicon carbide vertical MOSFET comprising a getter layer in between the pad metal and underlying structures, including an alternate structure including getter material in the dicing lane region.

FIG. 9 is a cross-sectional view of an embodiment of a vertical SiC MOSFET including a getter layer in the active region and the dicing lane. In this embodiment, the getter layer is provided in the active region between the pad metal and all underlying layers. The getter material is also provided in the dicing lane, including touching the SiC layer and extending up and over the passivation layer. Pad metal is optionally present in the dicing layer on top of the getter layer.

Figure 10:
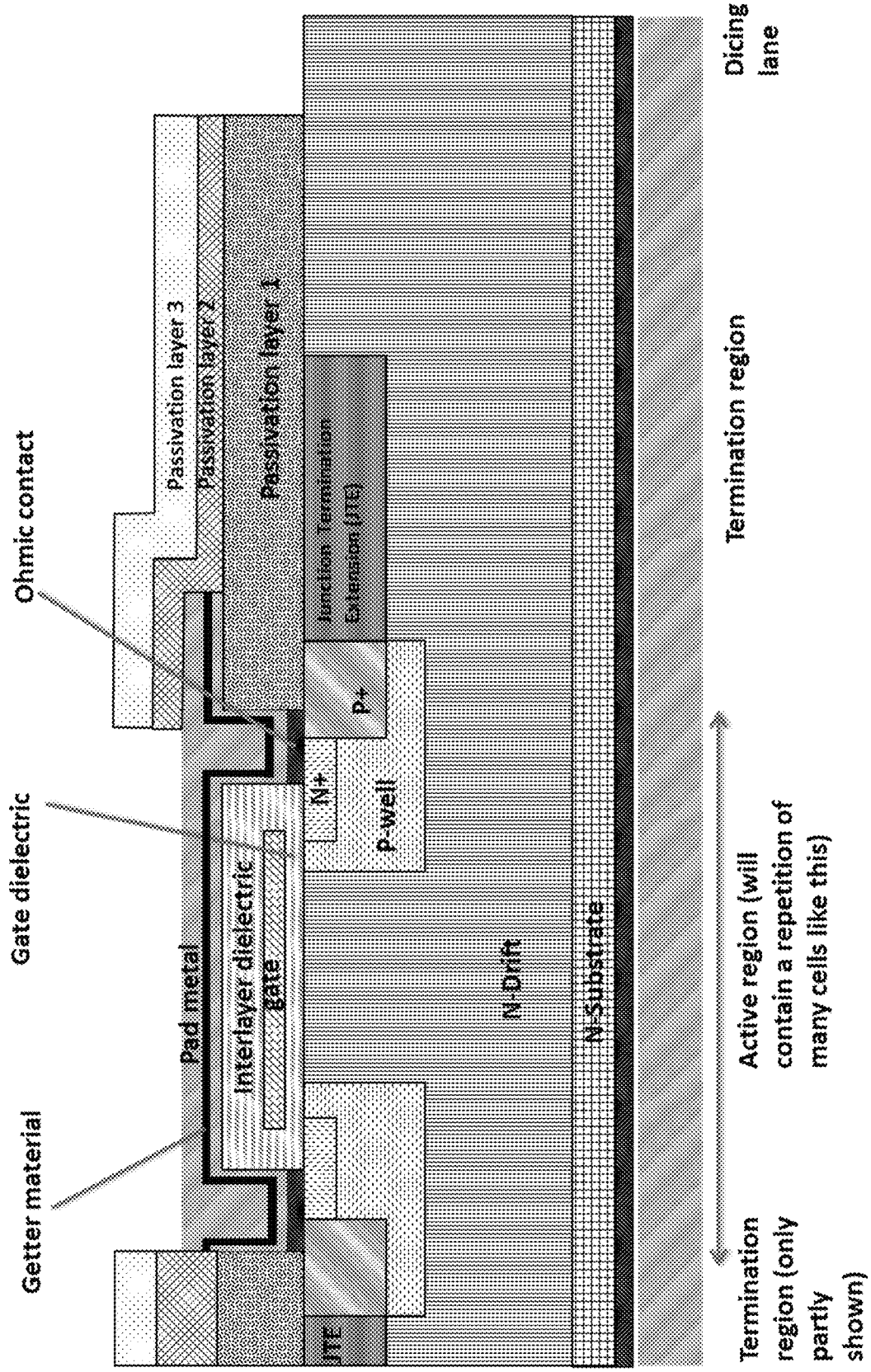
FIG. 10 is a cross-sectional view of a tenth embodiment of a silicon carbide vertical MOSFET comprising a getter layer incorporated as an intermediate layer within the pad metal layer.

FIG. 10 is a cross-sectional view of an embodiment of a vertical SiC MOSFET including a getter layer in the active region of the device. In this embodiment, the getter material is provided as an intermediate layer between multiple layers of pad metal. The getter is provided only in regions where pad metal is provided. Optionally, the intermediate layer of the getter and the pad metal is present in the dicing lane.

Figure 11:
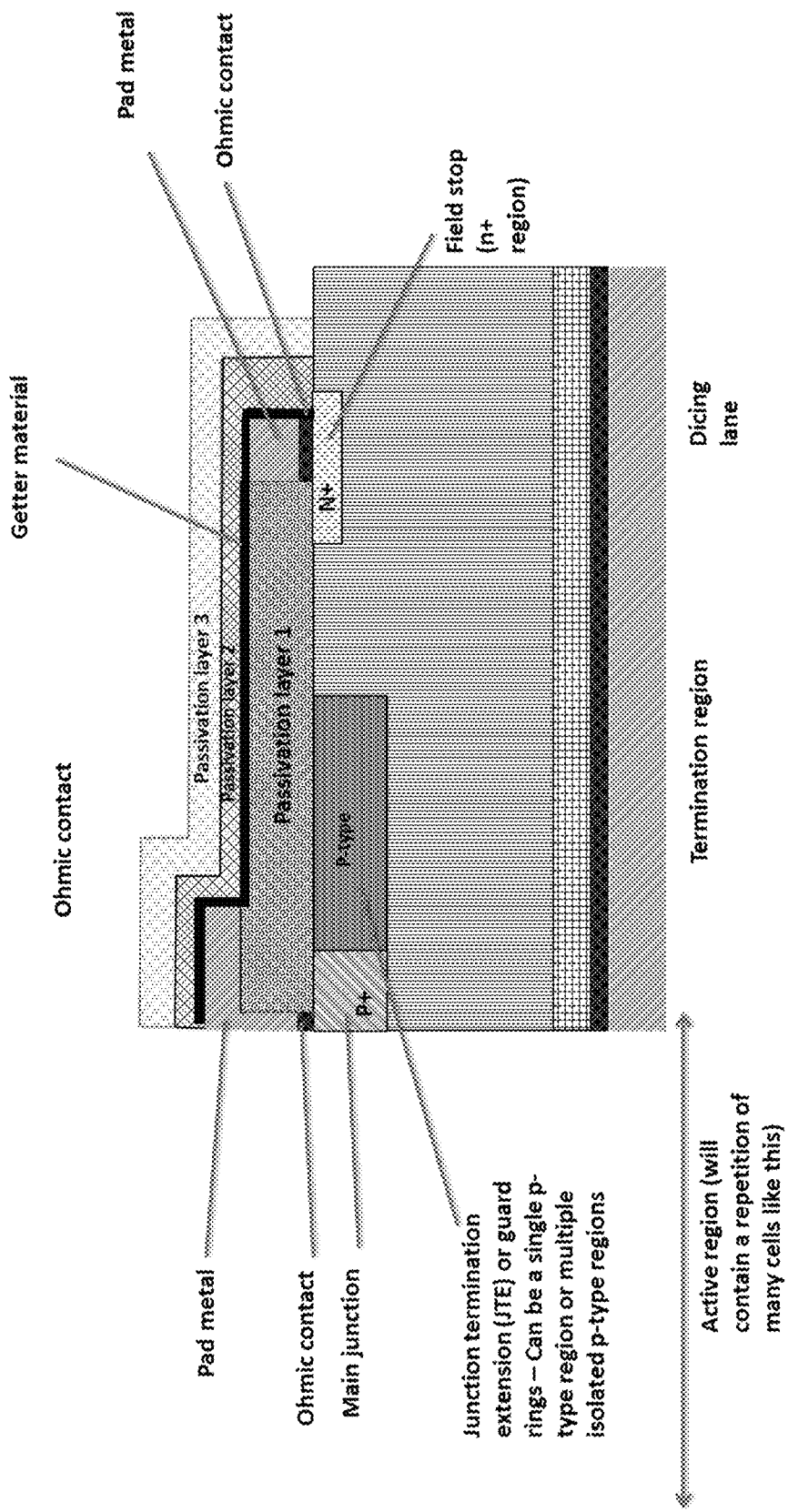
FIG. 11 is a cross-sectional view of a further embodiment of a semiconductor device comprising an active region and a termination region comprising multiple passivation layers, wherein the device comprises a getter material in the termination region between two passivation layers.

FIG. 11 is a cross-sectional view of a further embodiment of a semiconductor device comprising an active region and a termination region comprising multiple passivation layers, wherein the device comprises a getter material in the termination region between two passivation layers. According to some embodiments, Passivation layer 1 can comprise silicon dioxide and/or phosphosilicate glass. According to some embodiments, passivation layer 2 can comprise silicon nitride. According to some embodiments, passivation layer 3 can comprise polyimide. As shown in FIG. 11, the device can comprise a p-type junction termination extension (JTE) region in the termination region of the device. Alternatively, the device can comprise or plurality of isolated p-type regions circumscribing the central portion of the device thereby forming guard rings in the termination region of the device (not shown).

Figure 12:
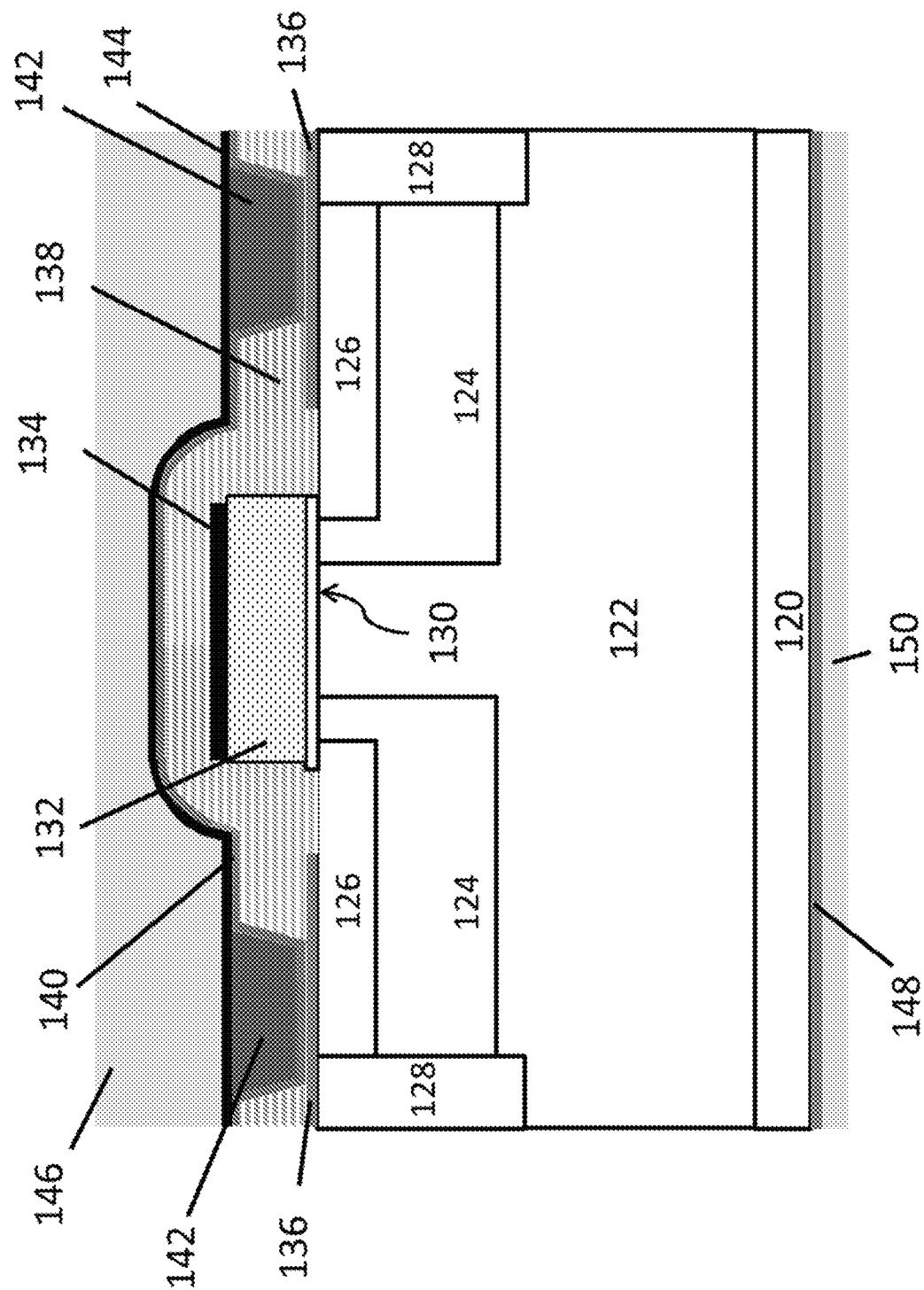
FIG. 12 is a cross-sectional view of a further embodiment of a MOSFET device comprising getter material on the gate, on the interlayer dielectric and on the source ohmic contacts.

FIG. 12 is a cross-sectional view of a further embodiment of a MOSFET device. As shown in FIG. 12, the MOSFET device comprises a drift layer 122 of a semiconductor material of a first type on a semiconductor substrate 120. The device also comprises a plurality of well regions 124 (2 shown) of a semiconductor material of a second conductivity type on the drift layer 122 and spaced apart from one another with region of semiconductor material of the first conductivity type (JFET region) between the well regions. Source regions 126 of a semiconductor material of the first conductivity type are on the well regions. The source regions 126 can be more heavily doped than the drift layer. Regions of semiconductor material of the second conductivity type 128 are adjacent the well regions 124 and source regions 126 in a peripheral portion of the device. Regions 128 can be more heavily doped than the well regions 124. A gate oxide layer 130 is formed in a central portion of the device in contact with the JFET region. A polysilicon gate 132 is on the gate oxide layer 130. A first getter material 134 is shown on the polysilicon gate 132. Source ohmic contacts 136 are on the source regions 126. An interlayer dielectric 138 is covering the polysilicon gate 132 and first getter material 134. A second getter material 140 is formed on the interlayer dielectric 138 over the polysilicon gate in the central portion of the device. As shown in FIG. 12, openings are formed in the interlayer dielectric 138 over the source ohmic contacts 136 and the second getter material 140 is on the surfaces of the opening, including on the surface of the source ohmic contacts 136 at the bottom of the opening. A third getter material 142 is in the openings. As shown in FIG. 12, a layer of a fourth getter material 144 is formed on the second and third getter materials. The fourth getter material can be titanium. A source metal layer 146 is shown covering the device. A drain ohmic contact 148 and a drain metal 150 are formed on the surface of the substrate opposite the drift layer.

The first getter material is optional. According to some embodiments, the first conductivity type is n-type and the second conductivity type is p-type.

According to some embodiments, the first getter material is tungsten silicide, the second getter material is a Ti/TiN layer, the third getter material is tungsten and/or the fourth getter material is titanium.

According to some embodiments, the device is a SiC semiconductor device.

According to some embodiments, the source ohmic contacts 136 are nickel silicide and/or the drain ohmic contact 148 is nickel silicide. According to some embodiments, the source metal is aluminum and/or the drain metal comprises titanium, nickel and silver.

The device depicted in FIG. 12 can be made by a method as set forth below. First, the "frontend" processing is performed by forming doped well regions 124, source regions 126 and regions 128 in the drift layer, performing high-temperature implant activation of the doped regions, forming the field oxide, patterning and etching the field oxide, growing the gate oxide, depositing and doping the polysilicon gate. A getter material can then be deposited over the gate. While referred to as a getter material, this material acts as a getter and/or barrier layer. Additionally, this material can reduce the gate resistance. Ohmic contacts are then formed on the front (source) and back (drain) of the wafer. As shown in FIG. 12, the source contacts can contact the regions 128. A nickel silicide Ohmic process can be used which includes depositing, patterning and etching a nickel layer, then annealing to form the nickel silicide (e.g., at 1000° C.). The interlayer dielectric (ILD) is then deposited. The ILD can be made of a combination of layers of undoped silicon dioxide and phosphorous-doped silicon dioxide. Via openings are then etched through the ILD over the source contacts. Getter material 140 can then be deposited over the ILD and in the via openings. The getter material 140 can be Ti/TiN. The Ti/TiN layer can be formed by depositing a Ti layer and annealing the layer in nitrogen at about 750° C. This converts a portion of the titanium layer to titanium nitride (TiN). The Ti layer can be approximately 50 nm in thickness. Getter material 142 can then be deposited and etched it back to form plugs in the vias. Getter material 142 can be tungsten (W). The combination of layers of Ti/TiN/W acts as getter and/or barrier layers. The final source metal can then be deposited. The source metal can be a combination of metals such as titanium and aluminum. For example, titanium (e.g., 0.25 µm thick) and aluminum (4 µm thick) can be deposited to form the final source metal. Optionally, the source metal can be annealed (e.g., at approximately 450° C.). The source metal can be etched to separate the source and gate contact regions. After etching of the source and gate contact regions, optionally additional passivation layers can be deposited. The additional passivation layers can comprise silicon nitride, silicon dioxide and polyimide.

Figure 13:
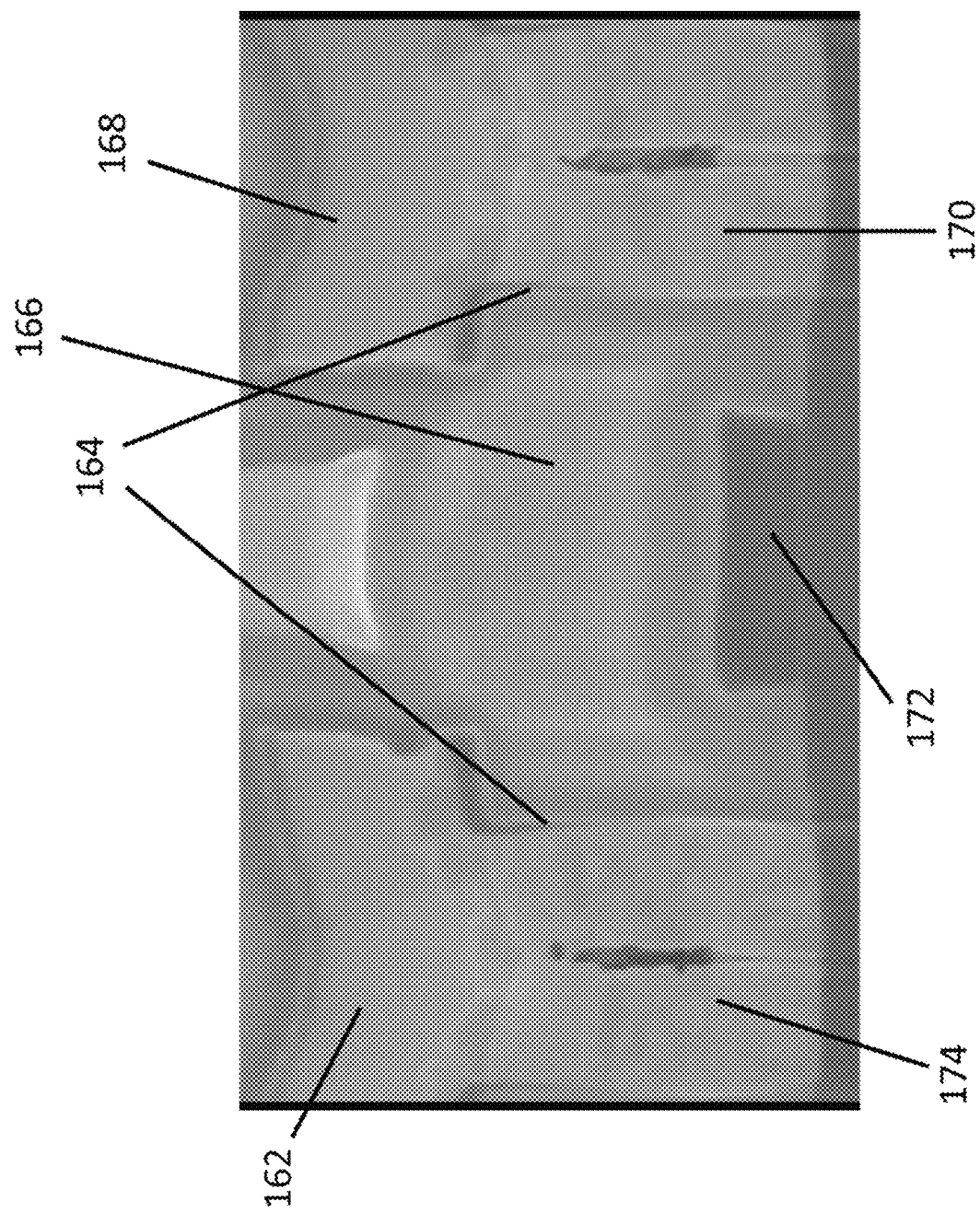
FIG. 13 is a scanning electron micrograph of a cross-section of a SiC MOSFET device having a structure as shown in FIG. 12 showing the top metal layers and interlayer dielectric.

FIG. 13 is a scanning electron micrograph of a cross-section of a MOSFET of having a structure as shown in FIG. 12 wherein the first getter material is tungsten silicide, the second getter material is a Ti/TiN layer, the third getter material is tungsten and the fourth getter material is titanium. The final metal 162, Ti/TiN layers 164, interlayer dielectric 164, source metal 168, Tungsten plugs 170, 174 and polysilicon gate 172 are shown in FIG. 13.

Figure 14:
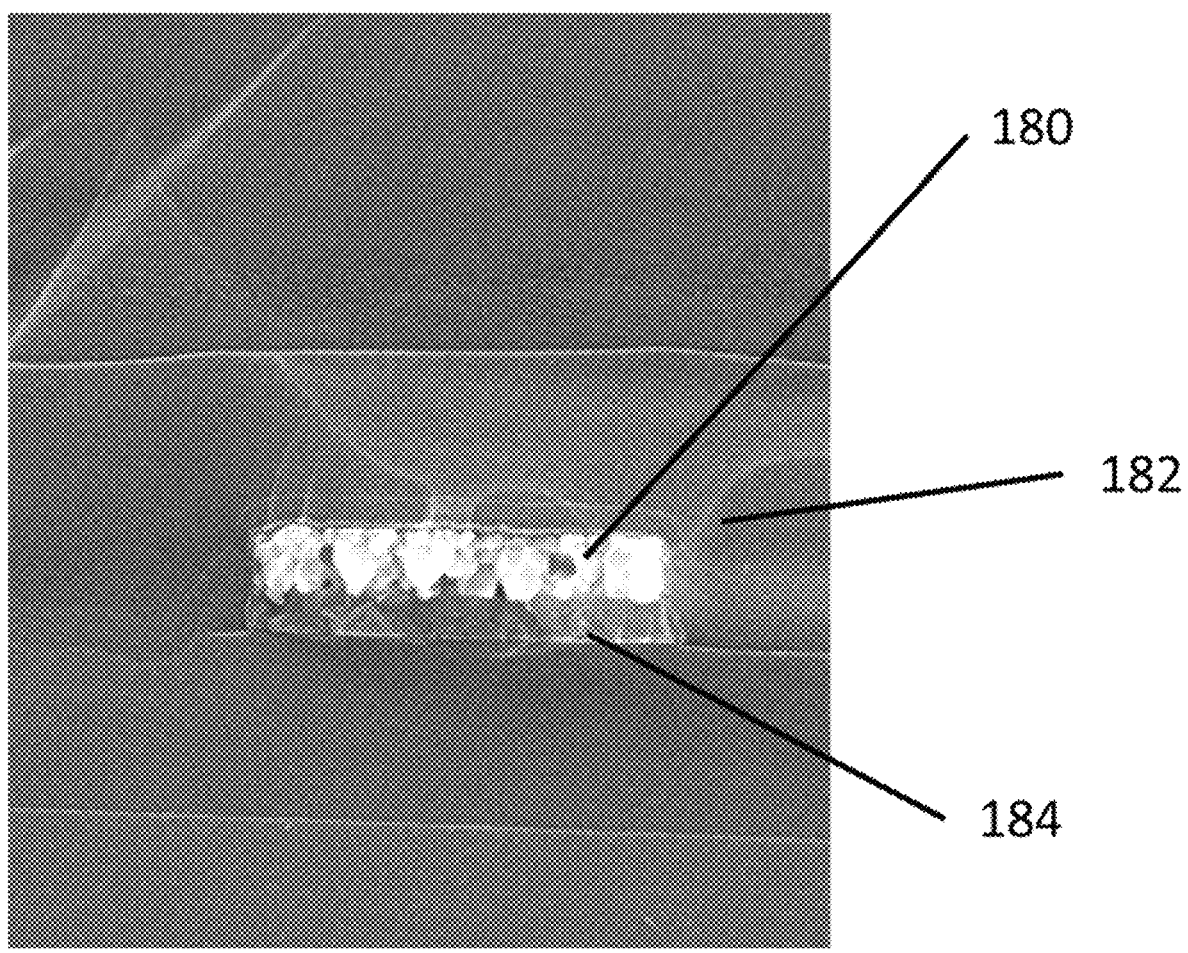
FIG. 14 is a scanning electron micrograph of a cross section of the device of FIG. 13 showing the getter material on the polysilicon gate.

FIG. 14 is a scanning electron micrograph of a cross section of a MOSFET showing the first getter material 180 (Tungsten Silicide) on the polysilicon gate 184. The interlayer dielectric 184 is also shown in FIG. 14.

According to some embodiments, an electronic device is provided that comprises at least one getter material. The device can be a SiC electronic device such as a SiC MOSFET. According to some embodiments, the getter material is a material selected to getter hydrogen. According to some embodiments, the getter material is a material selected to getter water.

The getter material can be dispersed into a matrix of a different material. The getter material can be present in the device as a continuous or discontinuous film.

According to some embodiments, the getter material can be located in the termination region of the device (e.g., in a peripheral region or toward the edges of the device). According to some embodiments, the getter is located in an active area of the device (e.g., where the device conducts current).

According to some embodiments, a self-aligned Titanium process can be used to form source and body ohmic contacts simultaneously to the SiC n+ and p+ regions of a SiC semiconductor device such as a SiC power MOSFET. The formation of the source and body contacts can then be followed by deposition of a Titanium/Aluminum final metal layer for the source metal.

This self-aligned Titanium layer and the subsequent Titanium layer can both act as getters to collect undesirable chemical species or prevent them from entering the active regions of the device.

Processing of Titanium-based Ohmic contacts on SiC differs from processing silicon, in that higher processing temperatures are required to form high-quality Ohmic contacts to SiC. Temperatures in the range of up to 950° C. to 1100° C. are typically used to form low-resistivity Titanium-based Ohmic contacts to SiC. In titanium-based contacts to silicon, no carbide species are formed. In contrast, Titanium reacts with SiC during annealing at 950° C. to 1100° C. to form titanium silicide carbide due to the presence of Titanium, Silicon and Carbon.

Figure 15A:
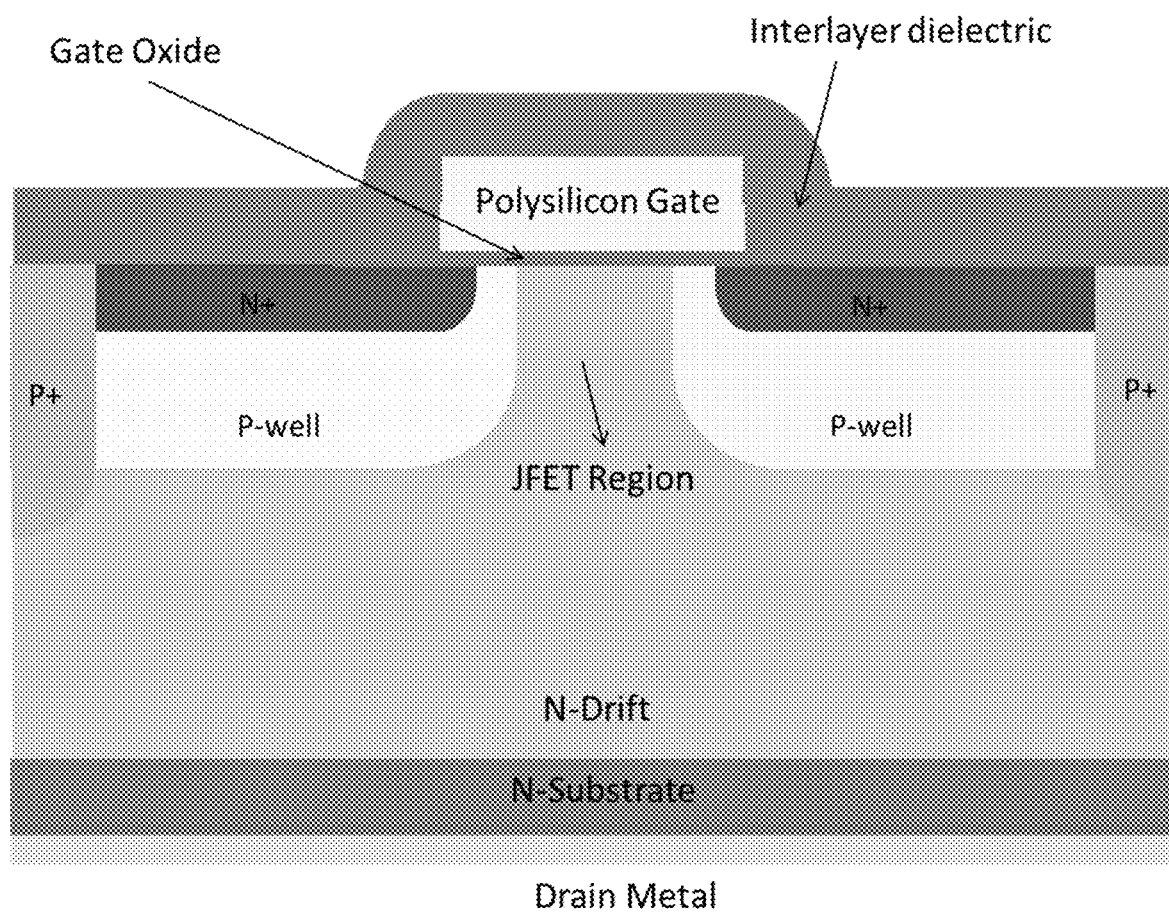
FIGS. 15A-15G are schematics illustrating a method of making a MOSFET device comprising a getter material according to a further embodiment wherein a self-aligned process is used to form the source contacts.

According to some embodiments, a process as depicted in FIGS. 15A-15H can be used to form the self-aligned source and body contacts. As shown in FIG. 15A, the process involves forming p-well, n-type source regions (denoted N+ in FIG. 15A), and p+ regions in a SiC drift region (denoted N-drift in FIG. 15A). P+ refers to a p-type region that has a higher dopant concentration than the p-type well regions. These regions can be formed by ion implantation using known techniques. As shown in FIG. 15A, the implanted p-well regions are spaced apart in the drift layer leaving an n-type JFET region between the well regions. The implants can then be activated by annealing (e.g., by high-temperature processing at temperatures>1600° C.).

The gate oxide layer can then be formed on the JFET region as shown in FIG. 15A. The gate electrode, which can be polysilicon as shown in FIG. 15A, can then be deposited on the gate oxide layer, patterned and etched. The gate electrode is denoted "polysilicon gate" in FIG. 15A. As also shown in FIG. 15A, an interlayer dielectric can then be deposited over the gate electrode and over the N-type source and P+ regions.

Figure 15B:
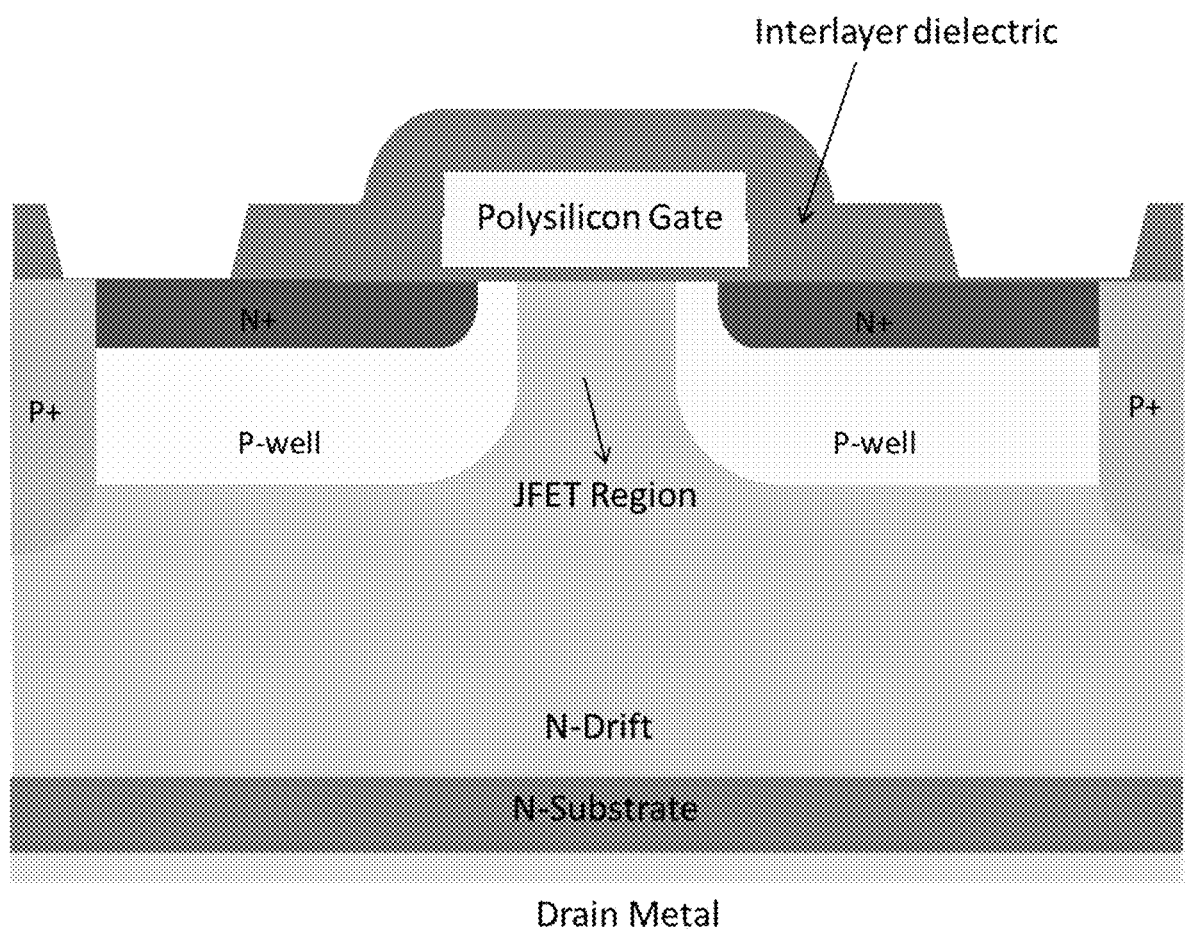
Figure 15C:
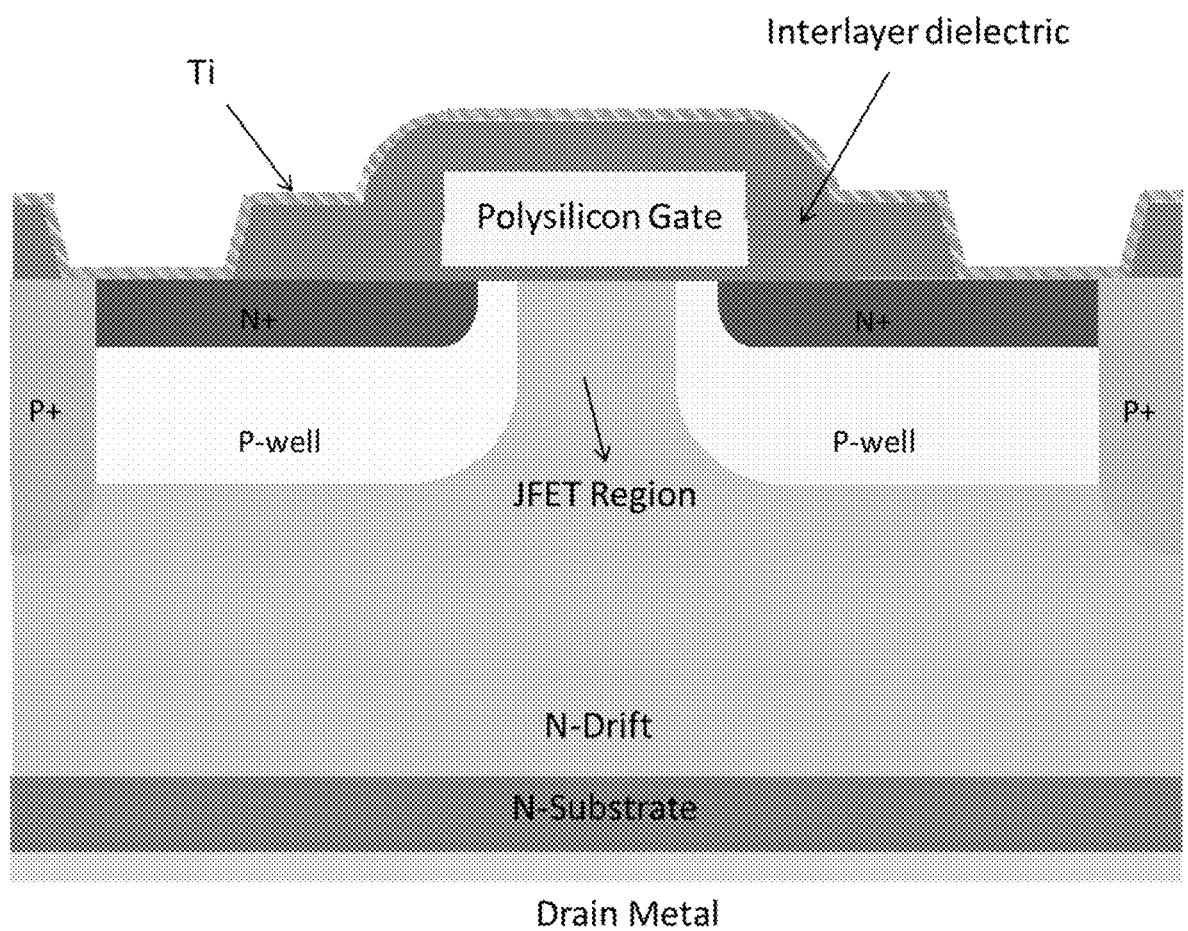
Figure 15D:
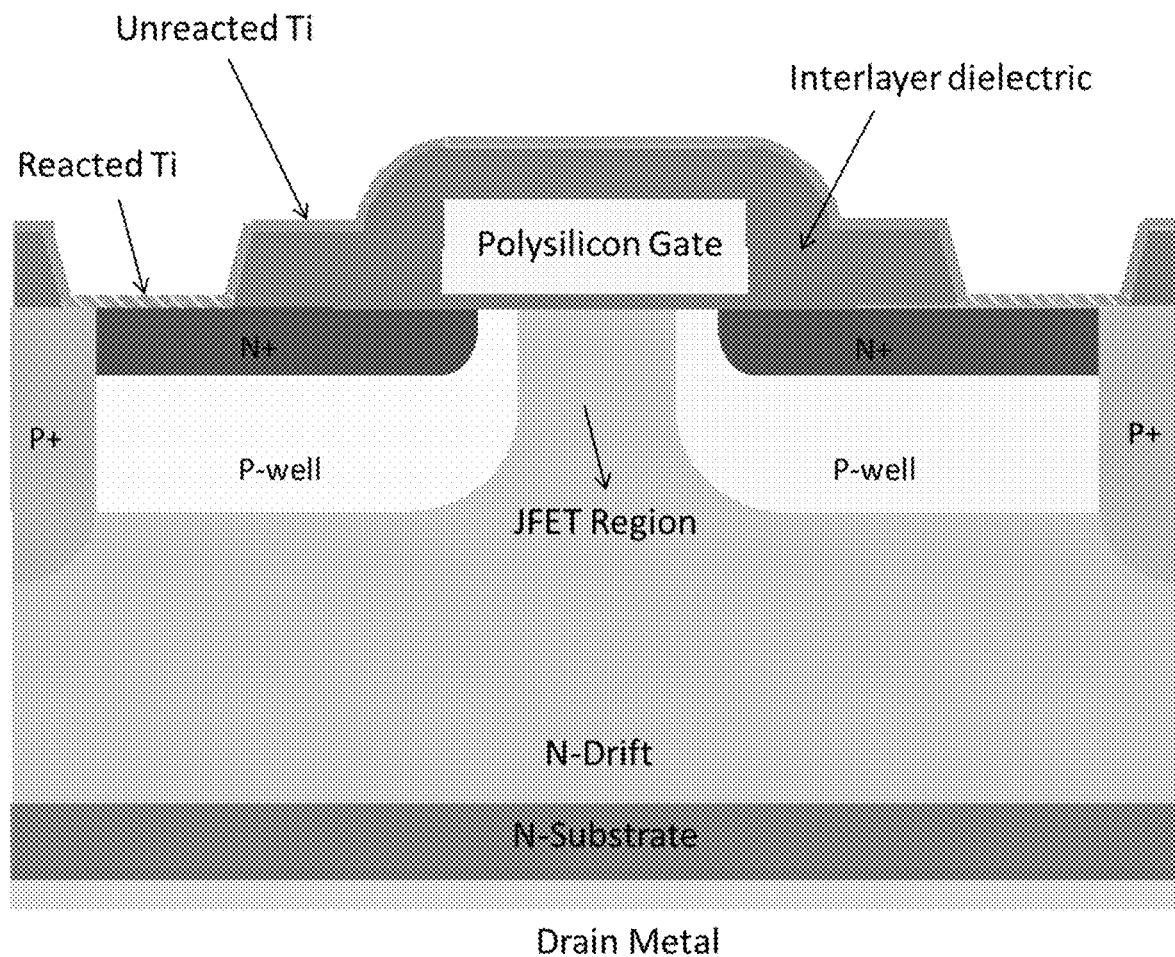

As shown in FIG. 15B, openings are then etched through the interlayer dielectric over the N-type source and P+ regions. An optional sputter surface cleaning can then be performed. As shown in FIG. 15C, a titanium layer is then deposited (e.g., thickness range of 10-100 nm). A first thermal anneal is then performed (e.g., 650-800° C., about 3 minutes in Nitrogen or Argon). During annealing, the titanium can react with the SiC surface to form a thin layer of Titanium-silicide and/or titanium-silicide-carbide in the regions where the Ti contacts SiC. Limited or no reaction occurs between the Titanium layer and silicon dioxide interlayer dielectric. As a result of annealing, portions of the titanium layer on the n-type source regions and the P+ regions react with underlying SiC to form source and body contacts (denoted "Reacted Ti") and portions remain unreacted as shown in FIG. 15D.

Figure 15E:
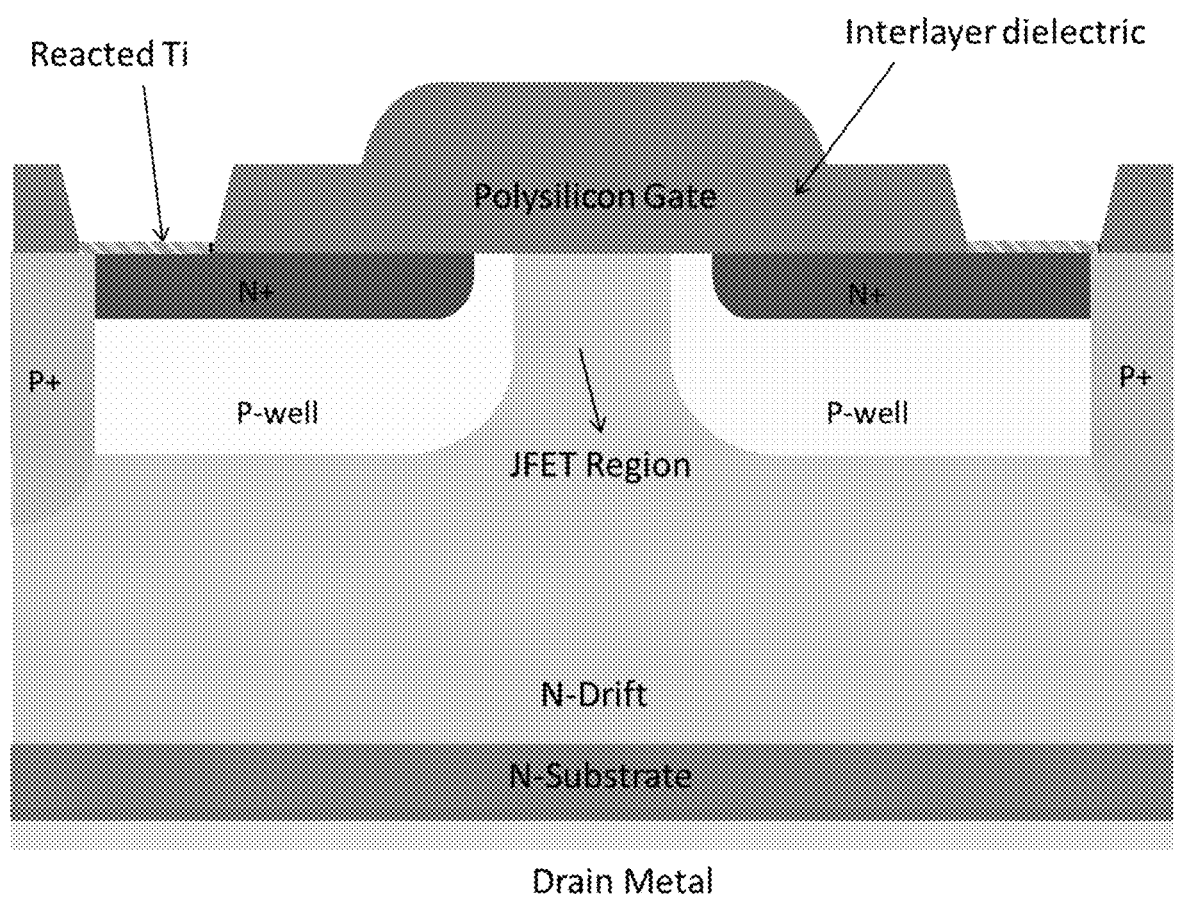
Figure 15F:
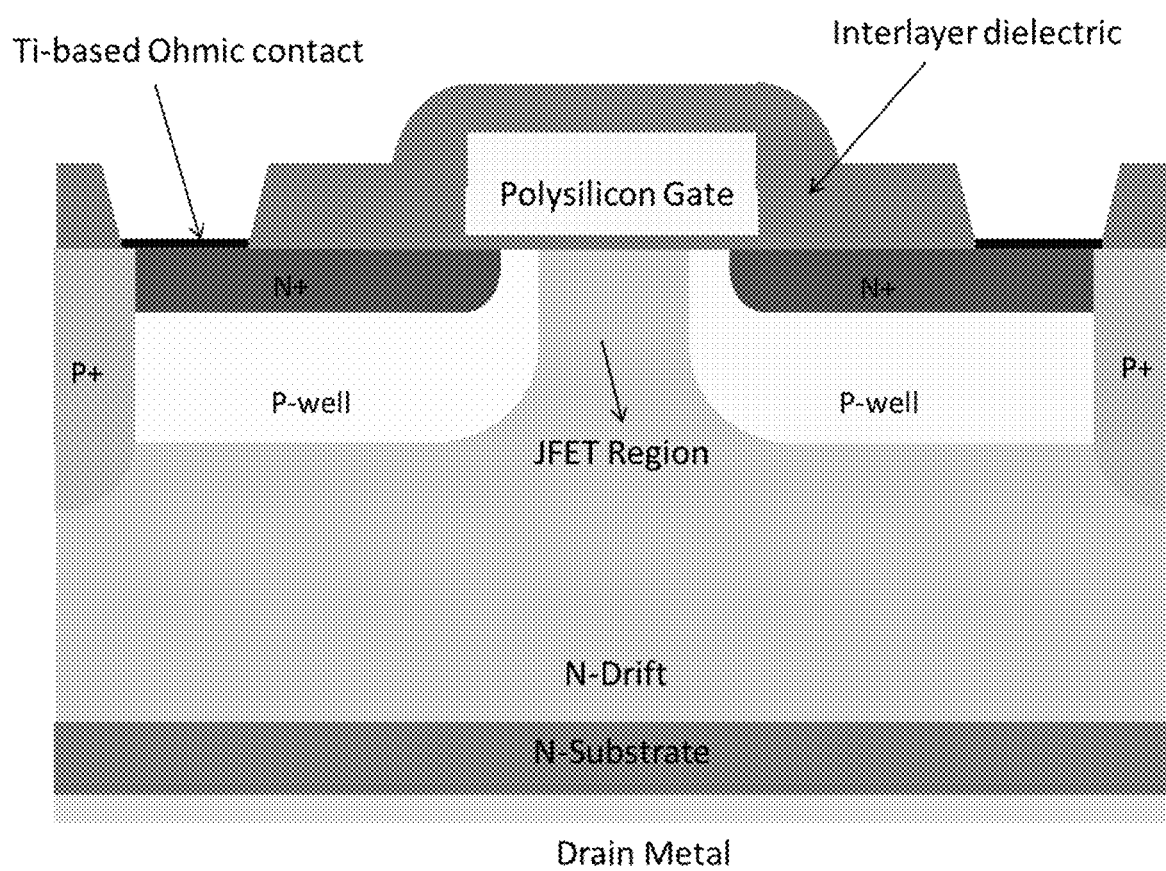
Figure 15G:
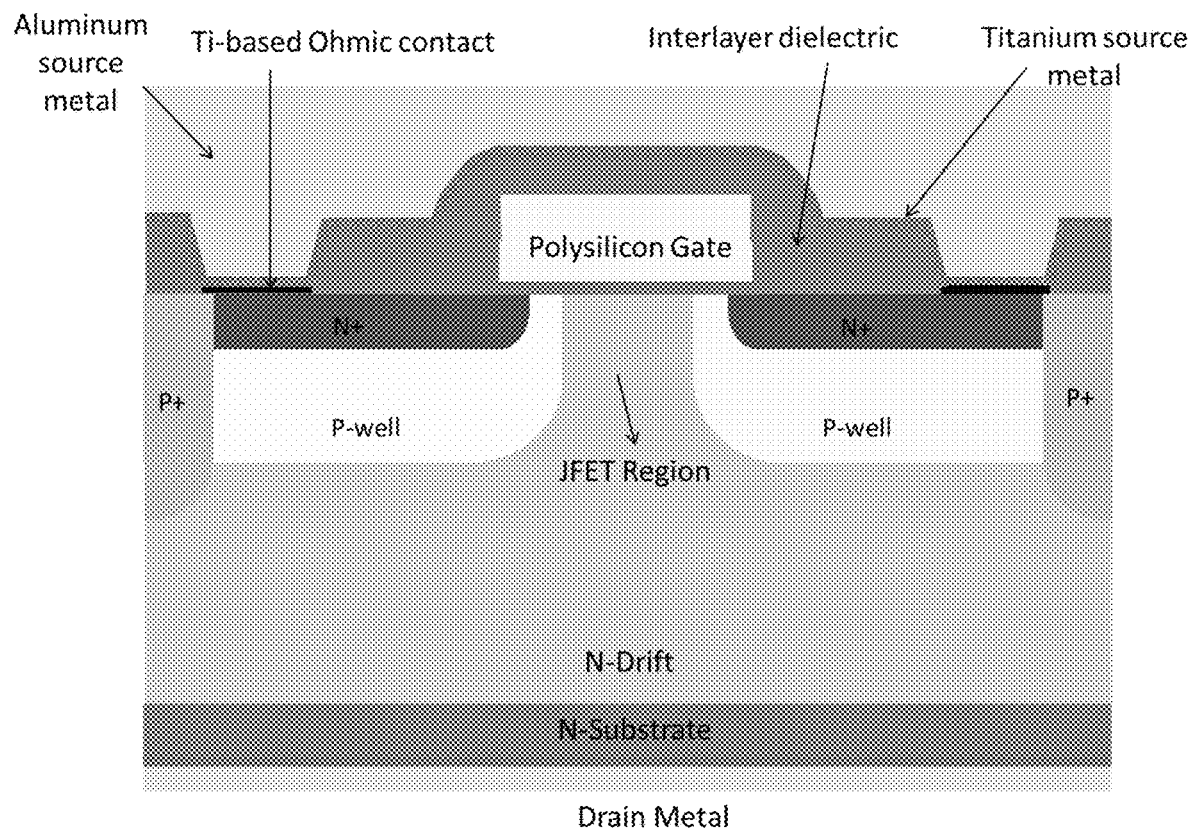

The unreacted Titanium can then be removed (e.g., in a wet chemical solution such as $NH_4OH:H_2O_2:H_2O$ mixture at ~70° C.) leaving the Reacted Ti material on the n-type source regions as shown in FIG. 15E. A second thermal anneal can then be performed (e.g., 950-1100° C., about 3 minutes in Nitrogen or Argon). In this step, the titanium in the source and body contacts can further react with SiC to form additional titanium-silicide-carbide phases that have contact resistivity to SiC (e.g., contact resistivity<$1\times10^{-4}$ Ohm-$cm^2$ to n-type SiC and contact resistivity<$1\times10^{-2}$ Ohm-$cm^2$ to p-type SiC). As a result, the Ti-silicide material is converted to Ti-based Ohmic contacts as shown in FIG. 15F. A sputter surface cleaning can then be performed. A titanium layer can then be deposited on the interlayer dielectric and on the source and body contacts as shown in FIG. 15G. A titanium nitride layer can then be deposited on the titanium layer (not shown in FIG. 15G). Optionally, the openings formed through the interlayer dielectric for the source ohmic contacts can be filled with a tungsten plug. A device having the vias filled with a Tungsten plug is shown in FIG. 16.

Figure 16:
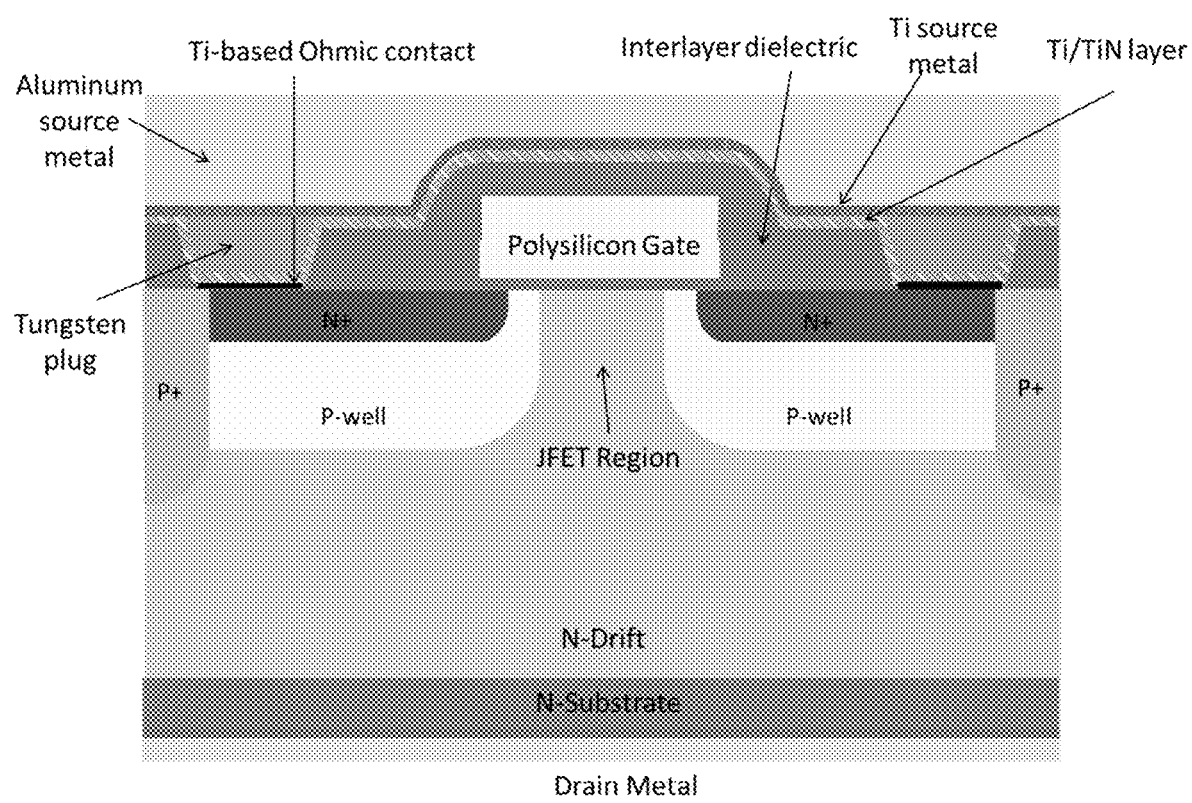
FIG. 16 is a schematic showing a MOSFET device comprising a getter material according to a further embodiment wherein a self-aligned process is used to form the source contacts and wherein a tungsten plug is used to fill the openings for the source contacts.

A Ti/Al layer can then be deposited (e.g., Ti: 200 nm, Al 4000 nm) as the final source metal as shown in FIG. 15G for a device without Tungsten plugs and in FIG. 16 for a device with Tungsten plugs.

According to some embodiments, the first source ohmic contact is coextensive with the first opening and the second source ohmic contact is coextensive with the second opening. In particular, since the titanium is deposited on the SiC material in the opening, annealing results in the formation of ohmic contacts that are coextensive (i.e., that have the same perimeter) as the openings at the interface between the interlayer dielectric and the SiC material. During annealing, Si and C will diffuse into the Ti layer to form Ti carbide and Ti silicide regions on the Ti side of the SiC/Ti interface. Since the Ti is deposited in the opening, the ohmic contact material on the Ti side of the interface will be coextensive with the openings in the interlayer dielectric. Some Ti may also diffuse into the underlying SiC layer during diffusion. Some of the diffusion may be in a lateral direction (i.e., parallel to the substrate) thereby forming ohmic contact material under the edges of the dielectric material near the opening.

The Ti/Al can be patterned and etched, and the Ti/TiN layer can be etched. Additional passivation layers may be deposited (for example, $SiO_2$ or doped $SiO_2$, Silicon nitride, polyimide) and patterned and etched for pad openings By using the self-aligned process, minimum feature dimensions, controlled only by the contact opening etch, can be achieved. Also, by using a self-aligned process there is no misalignment or tolerancing required between the source ohmic contact and the opening formed through the interlayer dielectric for the source metal.

The process also allows Titanium (Ti) metal to be used to form the ohmic contacts. Ti is commonly used in the semiconductor industry, and is easily processed in standard semiconductor process equipment. Titanium is also compatible with typical interlayer dielectrics such as silicon dioxide, phosphosilicate glass, boro-phosphosilicate glass and silicon nitride.

The Titanium-based contact may consist of titanium-silicide-carbide and which can act as a getter material for undesirable chemical species which can have a deleterious impact on the active regions of the SiC device. The use of titanium and subsequent annealing and formation of titanium-silicide-carbide makes Ohmic contact simultaneously to n-type and p-type SiC.

The optional use of the tungsten plug improves the device planarity so that the source metal, particularly Aluminum does not have any voids or "breadloafing".

According to some embodiments, a MOSFET device having titanium-based Ohmic contact to n-type and p-type SiC regions of the device is provided. The titanium-based contact can be self-aligned to the contact opening through the interlayer dielectric. The titanium-based contact can comprise a Titanium-silicide-carbide region. An additional Ti/Al stack can be present on top of the titanium-based Ohmic contact.

According to some embodiments, a MOSFET device having titanium-based Ohmic contact to n-type and p-type SiC regions of the device is provided wherein the specific contact resistivity to n-type SiC is less than $1\times10^{-4}$ Ohm-$cm^2$ is provided and/or wherein the specific contact resistivity to p-type SiC is less than $1\times10^{-2}$ Ohm-$cm^2$.

According to some embodiments, a MOSFET device having titanium-based Ohmic contacts to n-type and p-type SiC regions of the device is provided wherein a tungsten plug is formed over the having titanium-based Ohmic contacts.

According to some embodiments, a MOSFET device having titanium-based Ohmic contacts to n-type and p-type SiC regions of the device is provided wherein a Ti/TiN layer is formed on top of the titanium based Ohmic contact and contacting the interlayer dielectric.

According to some embodiments, a self-aligned process for forming Titanium-based Ohmic contacts to n-type and p-type regions of SiC simultaneously is provided. According to some embodiments, the process includes: forming one or more openings through an interlayer dielectric to expose underlying n-type and p-type SiC regions; depositing Ti on the n-type and p-type regions of SiC; conducting a first anneal at temperatures between 650-800° C.; removing unreacted Titanium; conducting a second anneal at temperatures between 950-1100° C. and depositing a source metal (e.g., Ti/Al stack) on top of the titanium-based Ohmic contact and over the interlayer dielectric.

The getter material can comprise an insulator, a metal, a metal oxide, a semiconductor, a polymer or other organic material.

The quantity of getter material in the device (e.g., the volume of getter material if present in a matrix or discontinuous or the thickness of a continuous film) is selected such that the quantity of getter can absorb an amount of chemical species equal or more than the amount of chemical species present in the dielectric films. The chemical species can be hydrogen, water or any other chemical species that can interact with the device. According to some embodiments, the quantity of getter material is selected to absorb more total chemical species than the device will be exposed to during the service life of the device.

According to some embodiments, the getter is used in coordination with other dielectric films.

According to some embodiments, a combination of one or more getter materials is used.

According to some embodiments, the getter material is protected from the ambient by a barrier layer such as a hydrogen or water barrier. According to some embodiments, the barrier layer comprises Titanium. According to some embodiments, the barrier layer comprises silicon nitride.

According to some embodiments, the barrier layer is on top of all device layers. According to some embodiments, the barrier layer is integrated within the device layers. (i.e., between layers of the device)

According to some embodiments, the semiconductor device comprising the getter material is a silicon carbide semiconductor device. According to some embodiments, the semiconductor device comprising the getter material is a gallium nitride semiconductor device.

According to some embodiments, the semiconductor device comprising the getter material is a MOSFET. According to some embodiments, the semiconductor device comprising the getter material is an IGBT. According to some embodiments, the semiconductor device comprising the getter material is a diode. For example, the device can be a device selected from the group consisting of a PiN diode, a Schottky diode, a JBS diode and an MPS diode.

According to some embodiments, the semiconductor device comprising the getter material is a bipolar junction transistor.

According to some embodiments, the semiconductor device comprising the getter material is selected from the group consisting of a JFET, a MESFET, a thyristor, a GTO, an IGCT, an IEGT, and an HEMT.

According to some embodiments, the semiconductor device comprises a getter and/or diffusion barrier at the outer edge of the termination. Locating the getter material at the outer edge of the termination may prevent diffusion along the SiC/passivation interface.

As shown in the drawings, various locations of the getter and/or barrier can be used. For example, the getter can be located on top of a gate electrode, on the interlayer dielectric, between the interlayer dielectric and the metallization, as part of the metallization layer or within the passivation layers over the termination.

While the foregoing specification teaches the principles of the present invention, with examples provided for the purpose of illustration, it will be appreciated by one skilled in the art from reading this disclosure that various changes in form and detail can be made without departing from the true scope of the invention.

What is claimed is:

1. A SiC semiconductor device comprising:
an active region; and
a termination region;
wherein the device comprises a getter material in the active region of the device, wherein the getter material comprises zirconium compound ZrO, palladium compound PdO, or platinum compound PtO.

2. The SiC semiconductor device of claim 1, wherein the getter material is an electrically insulating material.

3. The SiC semiconductor device of claim 1, wherein the getter material is an electrically conductive material.

4. The SiC semiconductor device of claim 3, wherein the active region of the device comprises one or more contacts or electrodes and wherein the one or more contacts or electrodes comprise the getter material.

5. The SiC semiconductor device of claim 1, wherein the device is a metal-oxide semiconductor field effect transistor (MOSFET) device.

6. The SiC semiconductor device of claim 1, wherein the device is a junction field effect transistor (JFET) device.

7. The SiC semiconductor device of claim 1, wherein the device comprises one or more ohmic contacts in the active region of the device and wherein the one or more ohmic contacts comprise titanium silicide and/or titanium silicide carbide.

8. The SiC semiconductor device of claim 1, wherein the getter material getters a chemical species selected from the group consisting of hydrogen and water.

9. A SiC semiconductor device comprising:
an active region; and
a termination region;
wherein the device comprises a getter material in the active region of the device, wherein the getter material comprises vanadium, tin, antimony, germanium, a polymeric material or a zeolite.

10. A SiC semiconductor device comprising:
an active region; and
a termination region;
wherein the device comprises a getter material in the active region of the device, wherein the getter material getters a chemical species selected from the group consisting of hydrogen and water.

* * * * *